(12) United States Patent
Yamauchi et al.

(10) Patent No.: US 11,201,121 B2
(45) Date of Patent: Dec. 14, 2021

(54) SEMICONDUCTOR DEVICE

(71) Applicant: FUJI ELECTRIC CO., LTD., Kawasaki (JP)

(72) Inventors: Kohei Yamauchi, Matsumoto (JP); Hiromichi Gohara, Matsumoto (JP); Ryoichi Kato, Matsumoto (JP); Yoshinari Ikeda, Matsumoto (JP); Katsumi Taniguchi, Matsumoto (JP)

(73) Assignee: FUJI ELECTRIC CO., LTD, Kawasaki (JP)

( * ) Notice: Subject to any disclaimer, the term of this patent is extended or adjusted under 35 U.S.C. 154(b) by 0 days.

(21) Appl. No.: 15/903,570

(22) Filed: Feb. 23, 2018

(65) Prior Publication Data

US 2018/0301422 A1 Oct. 18, 2018

(30) Foreign Application Priority Data

Apr. 14, 2017 (JP) .............................. JP2017-080813

(51) Int. Cl.
*H01L 23/00* (2006.01)
*H01L 23/31* (2006.01)
(Continued)

(52) U.S. Cl.
CPC .......... *H01L 23/562* (2013.01); *H01L 23/295* (2013.01); *H01L 23/3107* (2013.01); *H01L 23/3114* (2013.01); *H01L 23/3675* (2013.01); *H01L 23/3735* (2013.01); *H01L 23/4334* (2013.01); *H01L 23/46* (2013.01); *H01L 23/473* (2013.01); *H01L 23/49811* (2013.01); *H01L 23/49844* (2013.01); *H01L 24/16* (2013.01); *H01L 24/32* (2013.01); *H01L 24/40* (2013.01);
(Continued)

(58) Field of Classification Search
CPC ..... H01L 23/562; H01L 23/295; H01L 23/29; H01L 23/3221; H01L 23/42; H01L 23/46; H01L 23/473
See application file for complete search history.

(56) References Cited

U.S. PATENT DOCUMENTS 4,812,490 A * 3/1989 Kleeberg ............. C07D 251/34
257/E23.121
6,326,678 B1 * 12/2001 Karnezos ............ H01L 23/4334
257/666
(Continued)

FOREIGN PATENT DOCUMENTS

JP 2002-26469 1/2002
JP 200331765 A 1/2003
(Continued)

OTHER PUBLICATIONS

Japanese Office Action dated Feb. 2, 2021 from Japanese Application No. 2017-080813, 8 pages.

*Primary Examiner* — Sarah K Salerno

(57) ABSTRACT

A semiconductor device encompasses a cooler made of ceramics, having a first main face and a second main face, being parallel and opposite to the first main face, defined by two opposite side faces perpendicular to the first and second main faces, a plurality of conductive-pattern layers delineated on the first main face, a semiconductor chip mounted on the first main face via one of the plurality of conductive-pattern layers, and a seal member configured to seal the semiconductor chip.

11 Claims, 12 Drawing Sheets

(51) Int. Cl.
*H01L 23/367* (2006.01)
*H01L 23/46* (2006.01)
*H01L 23/29* (2006.01)
*H01L 23/373* (2006.01)
*H01L 23/433* (2006.01)
*H01L 23/473* (2006.01)
*H01L 23/498* (2006.01)

(52) U.S. Cl.
CPC .............. *H01L 24/45* (2013.01); *H01L 24/73* (2013.01); *H01L 24/84* (2013.01); *H01L 2224/40095* (2013.01); *H01L 2224/45124* (2013.01); *H01L 2224/48091* (2013.01); *H01L 2224/73221* (2013.01); *H01L 2224/73253* (2013.01); *H01L 2224/73263* (2013.01); *H01L 2224/73265* (2013.01); *H01L 2224/8484* (2013.01); *H01L 2224/8485* (2013.01); *H01L 2224/84801* (2013.01); *H01L 2924/00014* (2013.01); *H01L 2924/0781* (2013.01); *H01L 2924/1033* (2013.01); *H01L 2924/10253* (2013.01); *H01L 2924/10272* (2013.01); *H01L 2924/12032* (2013.01); *H01L 2924/1302* (2013.01); *H01L 2924/1305* (2013.01); *H01L 2924/1306* (2013.01); *H01L 2924/13032* (2013.01); *H01L 2924/13055* (2013.01); *H01L 2924/15787* (2013.01); *H01L 2924/181* (2013.01); *H01L 2924/3511* (2013.01); *H01L 2924/35121* (2013.01)

(56) References Cited

U.S. PATENT DOCUMENTS

| | | | |
|---|---|---|---|
| 7,245,493 B2 | 7/2007 | Inagaki et al. | |
| 8,742,556 B2 | 6/2014 | Kadoguchi et al. | |
| 9,305,910 B2 | 4/2016 | Horio et al. | |
| 10,319,665 B2 | 6/2019 | Maruyama | |
| 2003/0213979 A1* | 11/2003 | Nakajima | H01L 23/427 257/200 |
| 2005/0030717 A1 | 2/2005 | Inagaki et al. | |
| 2005/0046017 A1* | 3/2005 | Dangelo | H01L 25/0652 257/720 |
| 2011/0037166 A1* | 2/2011 | Ikeda | H01L 23/3735 257/712 |
| 2011/0309527 A1* | 12/2011 | Okamoto | H01L 23/295 257/782 |
| 2012/0181679 A1 | 7/2012 | Kadoguchi et al. | |
| 2013/0010425 A1* | 1/2013 | Son | H01L 23/4334 361/689 |
| 2014/0008781 A1* | 1/2014 | Nishi | H01L 23/52 257/691 |
| 2014/0332950 A1* | 11/2014 | Iwata | H01L 23/3107 257/712 |
| 2015/0243640 A1 | 8/2015 | Horio et al. | |
| 2016/0307821 A1 | 10/2016 | Maruyama | |
| 2016/0322333 A1* | 11/2016 | Fuergut | H01L 24/73 |

FOREIGN PATENT DOCUMENTS

| | | |
|---|---|---|
| JP | 200557102 A | 3/2005 |
| JP | 2008-103623 | 5/2008 |
| JP | 2011-115020 | 6/2011 |
| JP | 2012-146919 | 8/2012 |
| JP | 2013123014 A | 6/2013 |
| JP | 201453440 A | 3/2014 |
| WO | WO 2013/118415 A1 | 8/2013 |
| WO | WO 2014/132483 A1 | 9/2014 |
| WO | 2015194259 A1 | 12/2015 |
| WO | 2016009727 A1 | 1/2016 |
| WO | 2016111059 A1 | 7/2016 |

* cited by examiner

SEMICONDUCTOR DEVICE

CROSS-REFERENCE TO RELATED APPLICATIONS

This application is based upon and claims the benefit of priority from Japanese Patent Application No. 2017-080813, filed on Apr. 14, 2017, the entire contents of which are incorporated herein by reference.

BACKGROUND

1. Technical Field

The disclosure relates to a semiconductor device having a cooler.

2. Related Art

A power semiconductor module is a semiconductor device having one or more power semiconductor chips to achieve part or whole of conversion and connection. Each power semiconductor chip of the power semiconductor module is electrically connected to an external control circuit via a main terminal or a control terminal. Except for the main terminal and the control terminal, however, electrical insulating properties are desirably employed to design the power semiconductor module in light of electric leakage and the like. A power semiconductor device includes the power semiconductor module and a cooler for radiating heat of the power semiconductor chip. The power semiconductor device is industrially used for a motor drive control inverter for an elevator, and the like. In recent years, the power semiconductor device is widely used for an in-vehicle motor drive control inverter, a DC-DC converter, and the like. Miniaturization, high-power capability and long-term reliability are required.

In the power semiconductor device, as the miniaturization and the high-power capability are advanced further and further, it is important to efficiently radiate heat of the semiconductor chip. In this regard, JP 2002-26469 A discloses a circuit board including a ceramic board. On a front face of the ceramic board, a circuit pattern is provided. A rear face of the ceramic board is in contact with a coolant. The semiconductor chip is bonded to a surface of the circuit pattern, which allows the ceramic board to directly contact the coolant. That is, in JP 2002-26469 A, the ceramic board may serve as a cooler.

JP 2008-103623 A discloses a semiconductor device including a pair of lead frames which sandwiches a semiconductor chip, a resin which seals the semiconductor chip and the pair of lead frames with outer surfaces of the pair of lead frames exposed, and ceramic tubes which respectively have heat-dissipation channels and are bonded to the outer surfaces of the pair of lead frames. Each of the heat-dissipation channels has two opposite walls which are different in thickness. The thinner one of the two opposite walls is bonded to the outer surface of each of the pair of lead frames, thereby making it possible to decrease thermal resistance of the heat radiating channels and increase cooling efficiency.

SUMMARY

A first aspect of the present invention inheres in a semiconductor device encompassing (a) a cooler made of ceramics, having a first main face and a second main face, being parallel and opposite to the first main face, defined by two opposite side faces perpendicular to the first and second main faces, (b) a plurality of conductive-pattern layers delineated on the first main face, (c) a semiconductor chip mounted on the first main face via one of the plurality of conductive-pattern layers, and (d) a seal member including a resin and a filler, configured to seal the semiconductor chip and the plurality of conductive-pattern layers so as to cover at least the first main face and the two opposite side faces.

A second aspect of the present invention inheres in a semiconductor device encompassing (a) a first cooler made of ceramics, having a first main face and a second main face, being parallel and opposite to the first main face, defined by two opposite first side faces perpendicular to the first and second main faces, (b) a second cooler made of the ceramics, having a third main face parallel to the first main face, and a fourth main face, being parallel and opposite to third main face, defined by two opposite second side faces perpendicular to the third and fourth main faces, (c) a plurality of first conductive-pattern layers delineated on the first main face, (d) a plurality of second conductive-pattern layers delineated on the third main face, (e) a semiconductor chip sandwiched in between the first main face and the third main face, respectively, via one of the plurality of first conductive-pattern layers and at least one of the plurality of second conductive-pattern layers, and (f) a seal member including a resin and a filler, configured to seal the semiconductor chip, the plurality of first conductive-pattern layers and the plurality of second conductive-pattern layers so as to cover at least the first main face, the two opposite first side faces, the third main face and the two opposite second side faces.

DETAILED DESCRIPTION

Figure 1:
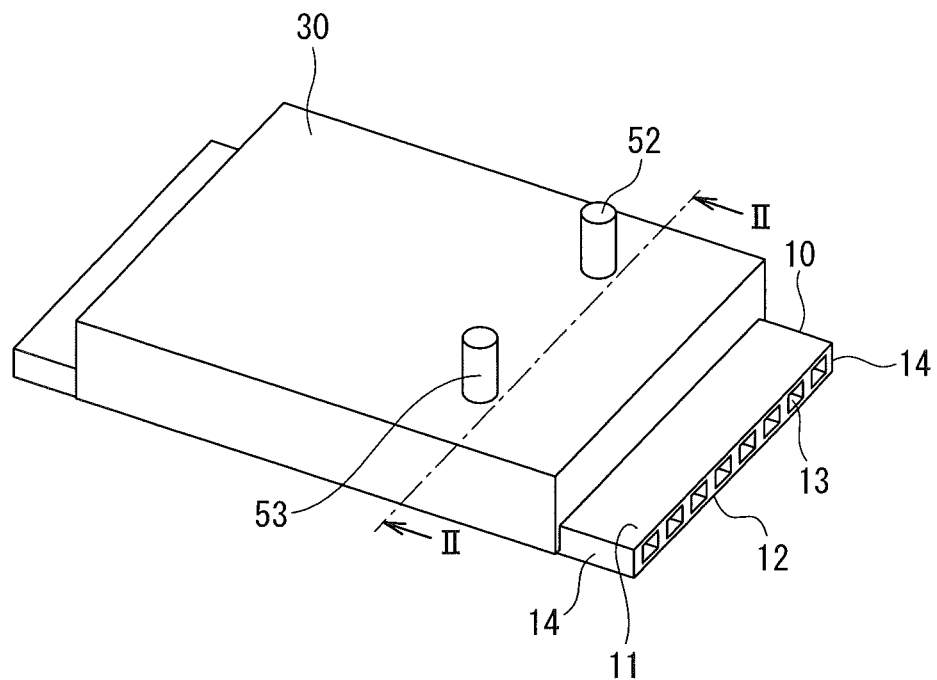
FIG. 1 is a perspective view of a basic structure of a semiconductor device according to a first embodiment of the present invention.

Exemplary embodiments of the invention will be described below in detail with reference to the drawings. The same or similar reference numerals are used to designate the same or similar elements throughout the drawings to avoid duplicated description. Since the drawings are schematic, a relationship between a thickness and plane dimensions, a ratio of thickness of each layer, and the like may be different from the actual one. Portions having different dimensional relations and ratios may also be included between drawings. The embodiments described hereinafter exemplify devices and methods for embodying the technical idea of the invention, and the technical idea of the invention does not specify the material, shape, structure, or arrangement of the elements described below.

The terms relating to directions, such as "upper," "lower," "top," and "bottom" in the following description will be used for the purpose of explanation and will not limit the technical idea of the invention. For example, when a target having upper and lower ends is rotated by 90°, the upper and lower ends of the target is expressed as left and right ends of the target, respectively. When the target is rotated by 180°, the upper end and the lower end is changed into the lower end and the upper end, respectively.

First Embodiment

Figure 2:
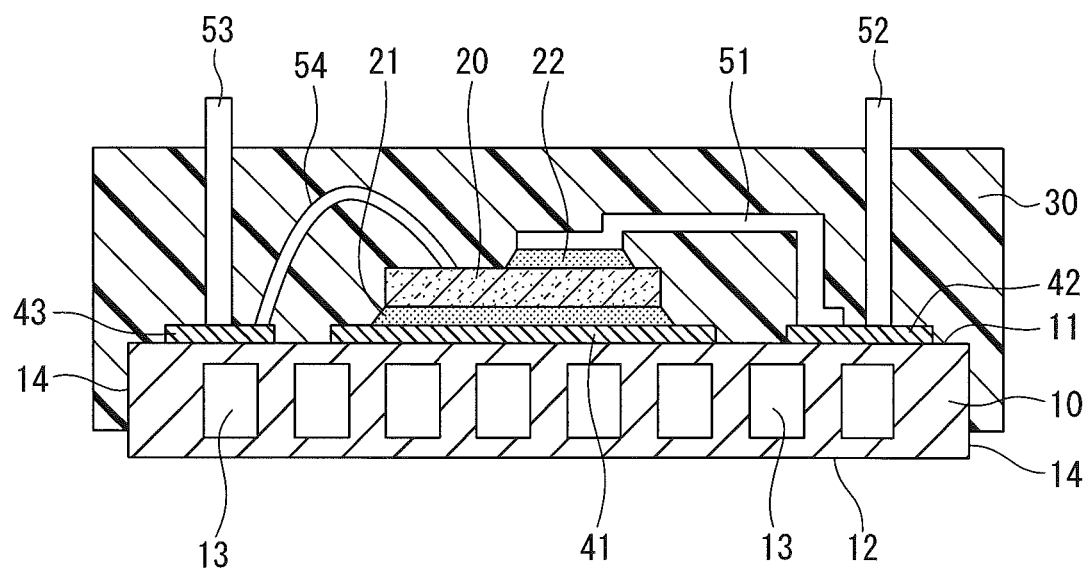
FIG. 2 is a cross-sectional view taken along line II-II of FIG. 1.

As illustrated in FIGS. 1 and 2, a semiconductor device according to a first embodiment of the present invention includes a cooler 10 made of ceramics, a chip-mount pattern 41 bonded to the cooler 10, a semiconductor chip 20 merging a semiconductor element, which is mounted on the chip-mount pattern 41, and a seal member 30 sealing the semiconductor chip 20. As illustrated in FIG. 1, the cooler 10 has a first main face 11 and a second main face 12, being parallel and opposite to the first main face 11. With rectangular flat-plate shape, the ends of the cooler 10 is defined by two opposite side faces 14, both perpendicular to the first main face 11 and the second main face 12. The semiconductor chip 20 is bonded to the first main face 11 of the cooler 10 via a part of the chip-mount pattern 41. The seal member 30 seals the semiconductor chip 20 so as to cover at least a part of the first main face 11 up to the second main face 12.

The cooler 10 may be a block shape, instead of the rectangular flat-plate shape, with a constant thickness. The cooler 10 includes a plurality of coolant-passages 13 configured to flow a coolant. The plurality of coolant-passages 13 may penetrate through a layer provided between the first main face 11 and the second main face 12, configured to flow a coolant. Each of the plurality of coolant-passages 13 extends parallel to one side of the cooler 10 and is opened at both ends of the cooler 10 in the extending direction (i.e., a longitudinal direction). The cooler 10 has two opposite side faces 14 at both ends in an array direction of the plurality of coolant-passages 13 (i.e., a horizontal direction in FIG. 2). The plurality of coolant-passages 13 is arranged in line parallel to the first main face 11. The windows of the plurality of coolant-passages 13 may be located on the first main face 11 or the second main face 12.

For the ceramics forming the cooler 10, an insulated high thermal conducting material, such as silicon carbide (SiC), silicon nitride ($Si_3N_4$), aluminum nitride (AlN), aluminium oxide ($Al_2O_3$), titania ($TiO_2$), zirconium dioxide ($ZrO_2$) and the like, may be used. Coefficient of thermal expansion of the ceramics is about $2\times10^{-6}$ to $12\times10^{-6}$ (/K), for example. The coefficient of thermal expansion of the ceramics is measured in a range between 20 degree centigrade and 250 degree centigrade in accordance with JIS R 1618.

The semiconductor chip 20 is rectangular flat-plate in shape, for example. The semiconductor chip 20 is made of silicon (Si), SiC, or gallium nitride (GaN). The semiconductor element provided in the semiconductor chip 20 may be selected from a semiconductor switching device, such as a bipolar junction transistor (BJT), a field-effect transistor (FET), a static induction transistor (SIT), an insulated-gate bipolar transistor (IGBT), a static induction thyristor (SI-thyristor), a gate turn-off (GTO) thyristor and the like. The semiconductor element(s) merged in the semiconductor chip 20 may include multiple semiconductor elements, or the semiconductor chip 20 may be a monolithic power integrated circuit (IC) including diodes such as Schottky diode. Alternatively, the semiconductor chip 20 may include a hybrid IC or module.

When the BJT is used as the semiconductor element implementing the semiconductor chip 20, a first main electrode may be assigned as either one of an emitter or a collector, a second main electrode may be assigned as the other electrode, and a control electrode indicates a base. For the FET, a first main electrode may be assigned as either one of a source or a drain, a second main electrode may be assigned as the other electrode, and a control electrode indicates a gate. For the SI-thyristor, a first main electrode may be assigned as either one of an anode or a cathode, a second main electrode may be assigned as the other electrode, and a control electrode indicates a gate. The semiconductor chip 20 may have a vertical structure in which the first and second main electrodes are disposed on two opposite main faces of the semiconductor chip 20, respectively, for example.

The semiconductor device according to the first embodiment further includes a first terminal-joint pattern 42, a second terminal-joint pattern 43, a lead frame 51, a first main terminal 52, a control terminal 53, a bonding wire 54, and jointing materials 21 and 22.

Each of the chip-mount pattern 41, the first terminal-joint pattern 42 and the second terminal-joint pattern 43 is a conductive-pattern layer forming a surface interconnecting circuit. The chip-mount pattern 41 is disposed on the first main face 11 of the cooler 10 so as to mate the semiconductor chip 20. The chip-mount pattern 41 is the conductive-pattern layer between the first main face 11 and the semiconductor chip 20. The first terminal-joint pattern 42 is disposed on the first main face 11 so as to mate the first main terminal 52. The first terminal-joint pattern 42 is the conductive-pattern layer between the first main face 11 and the first main terminal 52. The second terminal-joint pattern 43 is disposed on the first main face 11 so as to mate the control terminal 53. The second terminal-joint pattern 43 is the conductive-pattern layer between the first main face 11 and the control terminal 53. Each of the conductive-pattern layers preferably has a thickness of 0.1 millimeter or more and 5.0 millimeters or less, more preferably, 0.2 millimeter or more and 2.5 millimeters or less.

Each of the conductive-pattern layers is made of copper (Cu), for example, and is bonded to the first main face 11 by direct copper bonding (DCB) using eutectic bonding, active metal brazing (AMB) or others. Instead of copper, the conductive-pattern layers may be made of a conductive metal, such as copper alloy, aluminum (Al) or aluminum alloy. In addition, the conductive-pattern layers may be plated with nickel (Ni), gold (Au) or the like.

The semiconductor chip 20 is bonded to an upper surface of the chip-mount pattern 41 by the jointing material 21. Thereby, the second main electrode on a lower surface of the semiconductor chip 20 may be electrically connected to the chip-mount pattern 41, for example. The first main electrode on an upper surface of the semiconductor chip 20 is bonded to one end of L-shaped structure of the lead frame 51 by the jointing material 22. The jointing materials 21 and 22 may include solder, conductive adhesive, sintered metal such as silver (Ag) nanoparticles, and the like.

The other end of the lead frame 51 is bonded to an upper surface of the first terminal-joint pattern 42 by a jointing material (not illustrated). To the upper surface of the first terminal-joint pattern 42, a bottom of the first main terminal 52 is also bonded by a jointing material (not illustrated). Thereby, the first main terminal 52 is disposed vertically to the first main face 11 of the cooler 10 and may be electrically connected to the first main electrode on the upper surface of the semiconductor chip 20. Similarly to the first main terminal 52, the control terminal 53 has a bottom bonded to an upper surface of the second terminal-joint pattern 43 by a jointing material (not illustrated). The control terminal 53 is disposed vertically to the first main face 11 to be bonded to the second terminal-joint pattern 43, and may be electrically connected to the control electrode on the upper surface of the semiconductor chip 20 via the bonding wire 54. The bonding wire 54 is made of metal such as Al and the like.

Each of the first main terminal 52 and the control terminal 53 may be a cylindrical conductive pin. The first main terminal 52 and the control terminal 53 are sealed inside the seal member 30 except for their upper portions. The upper portions of the first main terminal 52 and the control terminal 53 protrude upward from an upper surface of the seal member 30. The first main terminal 52 and the control terminal 53 are made of metal, such as Cu, copper alloy, and the like. Instead of the circular cylindrical shape, the first main terminal 52 and the control terminal 53 may have another shape, such as a polygonal column. In addition, the first main terminal 52 and the control terminal 53 may be plated with Ni, Au or the like.

The second main electrode on the lower surface of the semiconductor chip 20 may be electrically connected to a second main terminal (not illustrated) via the chip-mount pattern 41. Similarly to the first main terminal 52 and the control terminal 53, the second main terminal is disposed vertically to the first main face 11 to be bonded to an upper surface of the conductive-pattern layer extending from the chip-mount pattern 41, for example.

As illustrated in FIG. 1, the seal member 30 seals the semiconductor chip 20 and the conductive-pattern layers. Moreover, the seal member 30 covers a continuous region of the cooler 10 extending from the first main face 11 to a part of the two opposite side faces 14 in a cross-sectional direction, which is taken perpendicular to the longitudinal direction of the plurality of coolant-passages 13, as illustrated in FIG. 2. The seal member 30 has lateral surfaces parallel to the two opposite side faces 14 of the cooler 10, which are parallel to the plurality of coolant-passages 13. Since the cooler 10 is connected to manifold-assemblies to allow a coolant to flow in the plurality of coolant-passages 13, the seal member 30 is provided over the cooler 10 excluding the both end portions where the manifold-assemblies are scheduled to be connected, as illustrated in FIG. 1.

The seal member 30 includes a thermo-setting resin and a filler. An example of the thermo-setting resin may be an epoxy resin or a resin containing epoxy as a principal component. An example of the filler may be inorganic insulated powder such as silica. A coefficient of thermal expansion of the seal member 30 is adjustable by changing addition amount of the filler to the resin. As the addition amount of the filler is larger, the coefficient of thermal expansion is smaller. An excessive amount of the filler, however, has an undesirable effect, such as insulating performance deterioration and mechanical weakness. For this reason, the coefficient of thermal expansion of the seal member 30 may be adjusted in a range of $13 \times 10^{-6}$ to $30 \times 10^{-6}$ (/K), for example. However, these values are larger than the coefficient of thermal expansion of the ceramics. The coefficient of thermal expansion of the seal member 30 is measured in accordance with JIS K 7197, in a range between 20 degree centigrade and 250 degree centigrade.

As described above, the seal member 30 covers the continuous region including the first main face 11 and the two opposite side faces 14 of the cooler 10. With the structure illustrated in FIG. 1, it is possible to suppress warpage of the entire module as well as crack and peeling by warping stress due to a difference in coefficient of thermal expansion between the seal member 30 and the ceramics. In contrast, the crack and peeling may occur when the seal member 30 covers only the first main face 11. Moreover, as the two opposite side faces 14 are located away from the semiconductor chip 20, the two opposite side faces 14 are less affected by heat from the semiconductor chip 20, and only a slight change in temperature is caused at the two opposite side faces 14. It is therefore possible to suppress the peeling and crack due to the difference in coefficient of thermal expansion by a configuration such that two ends of the seal member 30, which will serve as starting points from which the peeling and crack may occur, are provided, respectively, on the two opposite side faces 14.

First Modification

Figure 3:
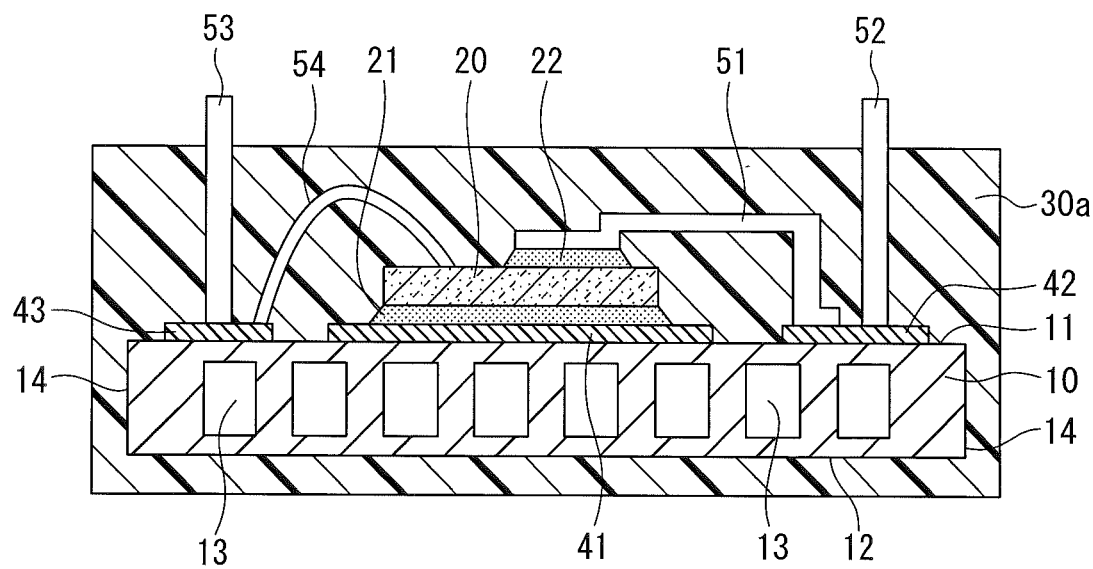
FIG. 3 is a cross-sectional view of a basic structure of a semiconductor device according to a first modification of the first embodiment.

As illustrated in FIG. 3, a semiconductor device according to a first modification of the first embodiment of the present invention is different from the first embodiment described above in that a seal member 30a surrounds the cooler 10 entirely. In the first modification, overlapping or redundant description of the same elements, functions and effects as those of the first embodiment will be omitted.

The seal member 30a covers all around the first main face 11, the two opposite side faces 14 and the second main face 12 in a cross-sectional direction, which is taken perpendicular to the longitudinal direction of the plurality of coolant-passages 13. That is, the seal member 30a extends from the first main face 11 and reaches the second main face 12 via the two opposite side faces 14 on both sides, wherein the two opposite side faces 14 are defined in the array direction of the plurality of coolant-passages 13 (i.e., a horizontal direction in FIG. 3). The seal member 30a has two outer lateral surfaces parallel to the two opposite side faces 14 of the cooler 10, the planes of the two opposite side faces 14 are parallel to the longitudinal directions of the plurality of coolant-passages 13. Similarly to the semiconductor device illustrated in FIG. 1, since the cooler 10 is connected to the manifold-assemblies to allow a coolant to flow in the plurality of coolant-passages 13, the seal member 30a is provided over the cooler 10 excluding the both end portions where the manifold-assemblies are scheduled to be connected.

As illustrated in FIG. 3, the seal member 30a surrounds entirely the cooler 10 in a cross-sectional direction, which is taken perpendicular to the longitudinal direction of the plurality of coolant-passages 13. Hence, the seal member 30a is continuously provided around the cooler 10. Thereby, since the seal member 30a has no ends around the cooler 10, the end serves as a starting point of peeling, it is possible to suppress crack and peeling of the seal member 30a from the cooler 10 due to the difference in coefficient of thermal expansion.

Since the seal member 30a is provided to surround entirely the cooler 10 in a cross-sectional direction, which is taken perpendicular to the longitudinal direction of the plurality of coolant-passages 13, it is possible to maintain a location of the seal member 30a relative to the cooler 10 even when peeling occurs on a boundary between the seal member 30a and the cooler 10, thereby reducing defect such as insulation failure or conduction failure due to breakage or warpage. In general, corner portions and a back side of the cooler 10 tend to contact or collide with another object in handling the semiconductor device. However, since the corner portions and the back side of the cooler 10 are protected with the seal member 30a, it is possible to suppress the breakage of the cooler 10.

Second Modification

Figure 4:
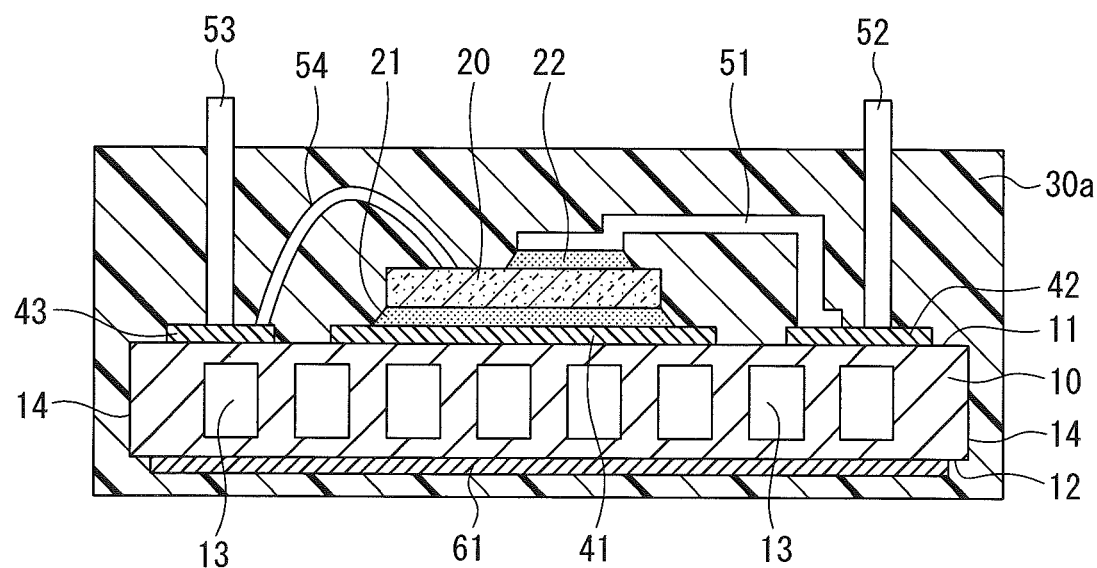
FIG. 4 is a cross-sectional view of a basic structure of a semiconductor device according to a second modification of the first embodiment.

As illustrated in FIG. 4, a semiconductor device according to a second modification of the first embodiment of the present invention includes a sheet-shaped buffer film 61 (adhesion layer) bonded to the second main face 12 of the cooler 10. In the second modification, overlapping or redundant description of the same elements, functions and effects as those of the first modification of the first embodiment will be omitted.

The buffer film 61 illustrated in FIG. 4 extends from one end to the other of the second main face 12. That is, the buffer film 61 extends along a direction in which the plurality of coolant-passages 13 is arrayed. And, the buffer film 61 bonds the second main face 12 of the cooler 10 and the seal member 30a. Although the buffer film 61 looks like a single film in FIG. 4, the buffer film 61 may be divided into multiple areas. The buffer film 61 preferably has a thickness of 0.1 millimeter or more and 5.0 millimeters or less, more preferably, 0.2 millimeter or more and 2.5 millimeters or less.

The buffer film 61 is preferably made of metal having larger coefficient of thermal expansion than that of ceramics, which is the material of the cooler 10. More preferably, the coefficient of thermal expansion of the buffer film 61 is in a range of $13 \times 10^{-6}$ to $25 \times 10^{-6}$ (/K). Coefficients of thermal expansion of metal are measured in accordance with JIS Z 2285, in a range between 20 degree centigrade and 250 degree centigrade.

Effects of the coefficient of thermal expansion of the buffer film 61 are assumed to be as follows: The coefficient of thermal expansion of the seal member 30a is in a range of $13 \times 10^{-6}$ to $30 \times 10^{-6}$ (/K) and is larger than the coefficient of thermal expansion of the cooler 10 made of ceramics, which is in a range of $2 \times 10^{-6}$ to $12 \times 10^{-6}$ (/K). For this reason, thermal stress may occur by heat cycle on a boundary between the seal member 30a and the cooler 10, so as to cause the seal member 30a to easily be peeled. On the other hand, when the buffer film 61 having a larger coefficient of thermal expansion than the cooler 10 made of ceramics is provided on the cooler 10, the thermal expansion of a bonded surface with the seal member 30a increases. Hence, the thermal stress in a bonding interface of the seal member 30a is reduced, making it difficult for the seal member 30a to be peeled.

As the coefficient of thermal expansion of the buffer film 61 is larger compared to ceramics that is the material of the cooler 10, the thermal expansion of the bonded surface with the seal member 30a is larger, thereby suppressing the peeling of the seal member 30a. If the coefficient of thermal expansion of the buffer film 61 is too large, however, the thermal stress on the boundary between the cooler 10 and the buffer film 61 increases. For this reason, if the coefficient of thermal expansion of the buffer film 61 is larger than $25 \times 10^{-6}$ (/K), undesired peeling and crack are likely to occur between the cooler 10 and the buffer film 61.

The buffer film 61 is made of Cu or copper alloy, for example, and is bonded to the second main face 12 of the cooler 10 by DCB using eutectic bonding, AMB or the like. The buffer film 61 can be formed of the same material as that of the chip-mount pattern 41, the first terminal-joint pattern 42 and the second terminal-joint pattern 43. Instead of Cu or copper alloy, the buffer film 61 may be made of Al, Al alloy, Ni, Ni alloy, stainless steel or the like. In addition, the buffer film 61 may be plated with Ni, Au or the like.

Figure 5:
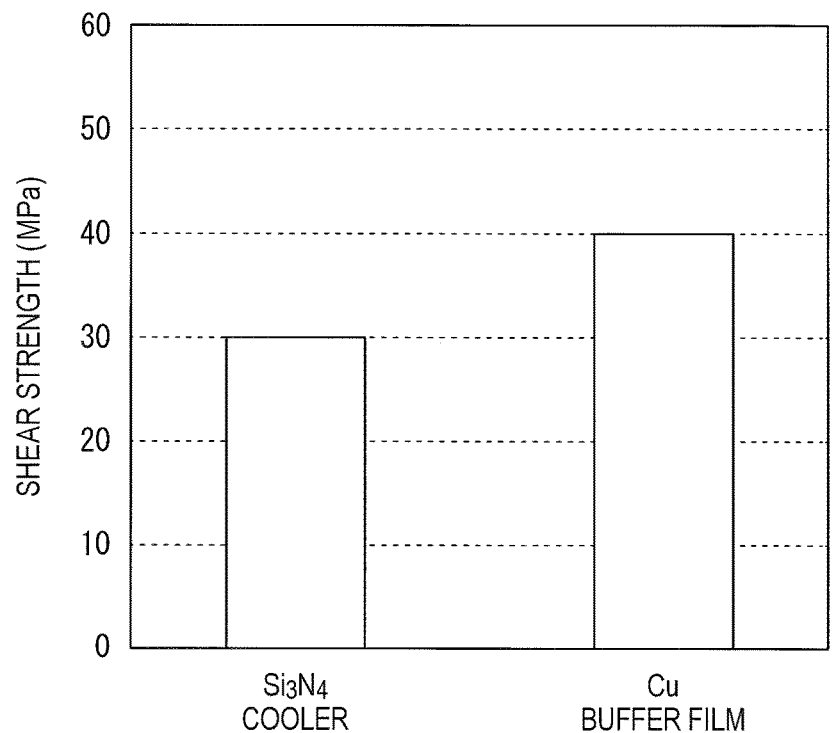
FIG. 5 is a graph illustrating shear strengths of silicon nitride and copper when resin is peeled from each of the silicon nitride and the copper.

FIG. 5 is a graph illustrating examples of shear strengths of the second main face 12 of the cooler 10 and the buffer film 61 bonded to the second main face 12 when the seal member 30a is peeled from each of the second main face 12 and the buffer film 61 in a pudding-cup test. The pudding-cup test is a test for curing a pudding-cup shaped resin on a surface of an object to measure shear strengths. In the example illustrated in FIG. 5, the cooler 10 is ceramics formed of $Si_3N_4$ and has coefficient of thermal expansion of $3.4 \times 10^{-6}$ (/K). The buffer film 61 is metal formed of Cu with thickness of 1.0 millimeter and has coefficient of thermal expansion of $17 \times 10^{-6}$ (/K). The seal member 30a is epoxy resin with the addition of silica filler, and has coefficient of thermal expansion of $18 \times 10^{-6}$ (/K). As illustrated in FIG. 5, the shear strength of the Cu buffer film 61 is larger than the shear strength of the $Si_3N_4$ cooler 10. This indicates that the Cu buffer film 61 has high adhesion to the seal member 30a. Thus, since the buffer film 61 made of metal having larger coefficient of thermal expansion is provided on the cooler 10 made of ceramics having smaller coefficient of thermal expansion, it is possible to enhance the adhesion to the seal member 30a made of resin with filler.

According to the semiconductor device of the second modification of the first embodiment, since the adhesion between the buffer film 61 and the resin of the seal member 30a is higher than the adhesion between the ceramics of the cooler 10 and the resin of the seal member 30a, the seal member 30a can be firmly bonded to the second main face 12 of the cooler 10 via the buffer film 61.

Moreover, according to the semiconductor device of the second modification of the first embodiment, the buffer film 61 having larger coefficient of thermal expansion than that of the cooler 10 is bonded to the second main face 12 of the cooler 10. Therefore, it is possible to reduce the thermal stress on the boundary between the seal member 30a and the second main face 12 of the cooler 10 due to the difference in coefficient of thermal expansion between the seal member 30a and the cooler 10.

Third Modification

Figure 6:
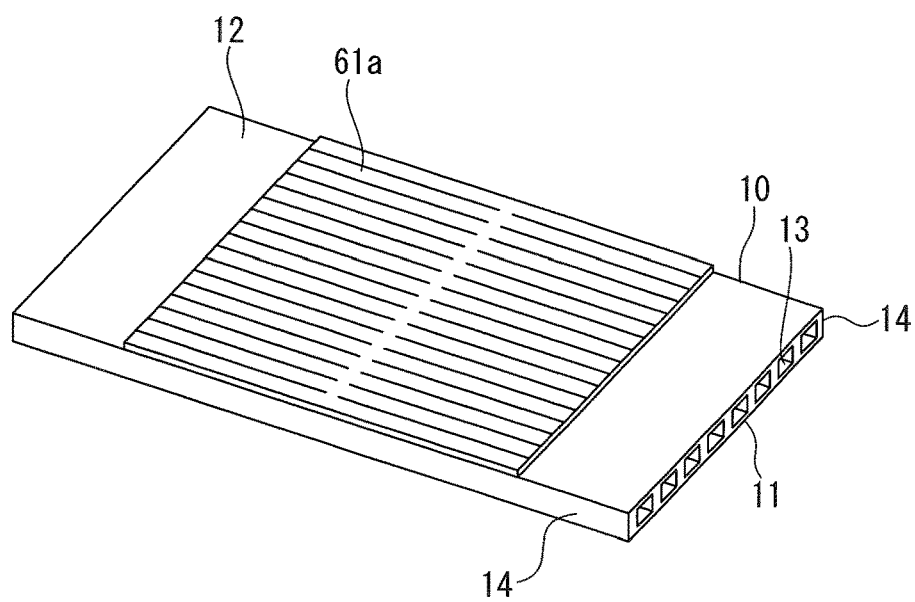
FIG. 6 is a perspective view of an example of a buffer film of a semiconductor device according to a third modification of the first embodiment.

As illustrated in FIG. 6, a semiconductor device according to a third modification of the first embodiment of the present invention is different from the second modification of the first embodiment in that a buffer film 61a having a plurality of slits is provided. In the third modification, overlapping or redundant description of the same elements, functions and effects as those of the second modification of the first embodiment will be omitted. Although the semiconductor device includes the seal member 30a (see FIG. 4), the seal member 30a is not illustrated in FIG. 6 in order to illustrate the plurality of slits on a surface of the buffer film 61a.

At the surface that adheres to the seal member 30a, the plurality of slits, which are parallel to the longitudinal direction of the plurality of coolant-passages 13, are cut in the buffer film 61a. Each of the plurality of slits may be a plurality of grooves, respectively, which are cut inward from an opposite plane of the buffer film 61a, the opposite plane is opposite to a contacting plane of the buffer film 61a, the contacting plane being contacting to the bottom of the second main face 12. Alternatively, each of the plurality of slits may be a plurality of holes, respectively, penetrating from the opposite plane to a back side of the buffer film 61a. The plurality of slits of the buffer film 61a causes an anchor effect, thereby enhancing the adhesion to the seal member 30a.

Figure 7:
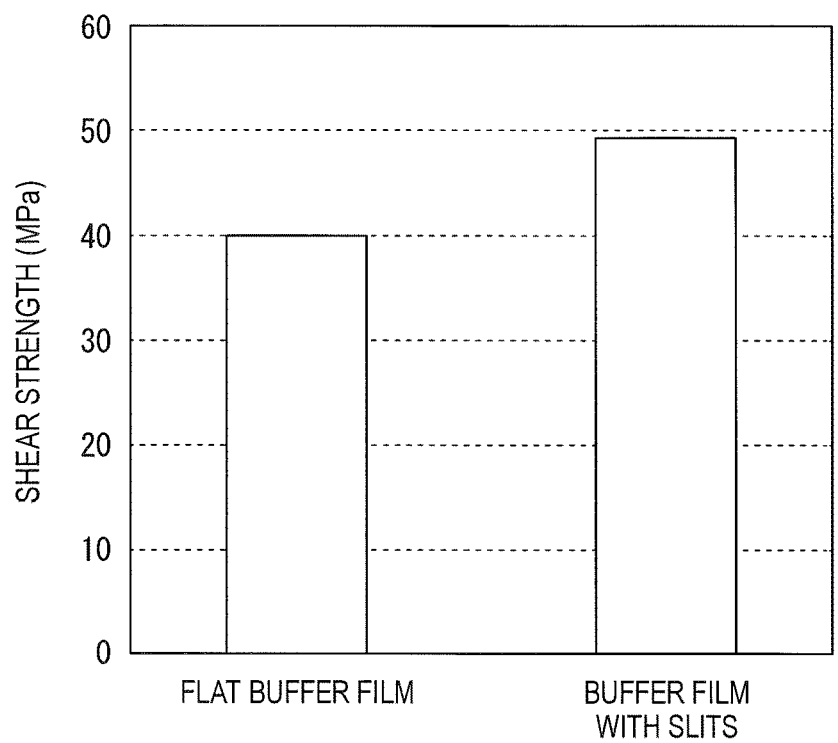
FIG. 7 is a graph illustrating shear strengths of a flat copper plate and a copper plate with slits when a seal member is peeled from each of the flat copper plate and the copper plate with slits.

FIG. 7 is a graph illustrating examples of shear strengths of the flat buffer film 61 bonded to the second main face 12 of the cooler 10 and the buffer film 61a with slits when the seal member 30a is peeled from each of the flat buffer film 61 and the buffer film 61a with slits in a pudding-cup test. In the example illustrated in FIG. 7, the buffer film 61a is made of Cu with a thickness of 1.0 millimeter. The slits are grooves parallel to one another, penetrating from the surface to the back side of the buffer film 61a, with a width of 0.5 millimeter and a pitch of 1.0 millimeter. The buffer film 61a with the slits has higher shear strength than the flat buffer film 61, and thus the buffer film 61a with slits has high adhesion to resin.

According to the semiconductor device of the third modification of the first embodiment, since the adhesion between the buffer film 61a and the seal member 30a is higher than the adhesion between the flat buffer film 61 and the seal member 30a, the seal member 30a can be firmly bonded to the cooler 10 via the buffer film 61a.

Figure 8:
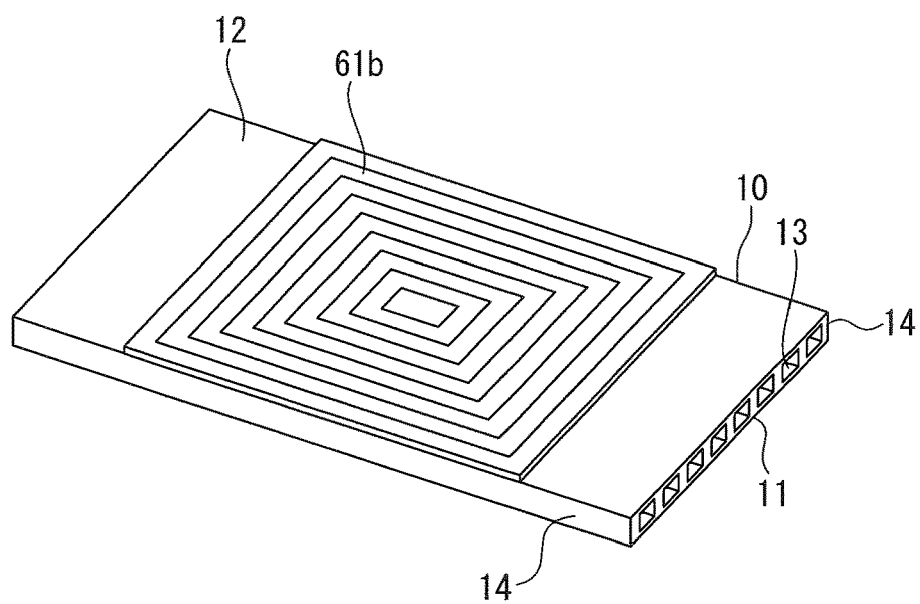
FIG. 8 is a perspective view of another example of the buffer film of the semiconductor device according to the third modification of the first embodiment.

A pattern of the slits of the buffer film 61a is not limited to a pattern parallel to the plurality of coolant-passages 13. As illustrated in FIG. 8, for example, a buffer film 61b having a plurality of homothetic rectangular slits, which are arranged coaxially and periodically, may be employed.

Fourth Modification

Figure 9:
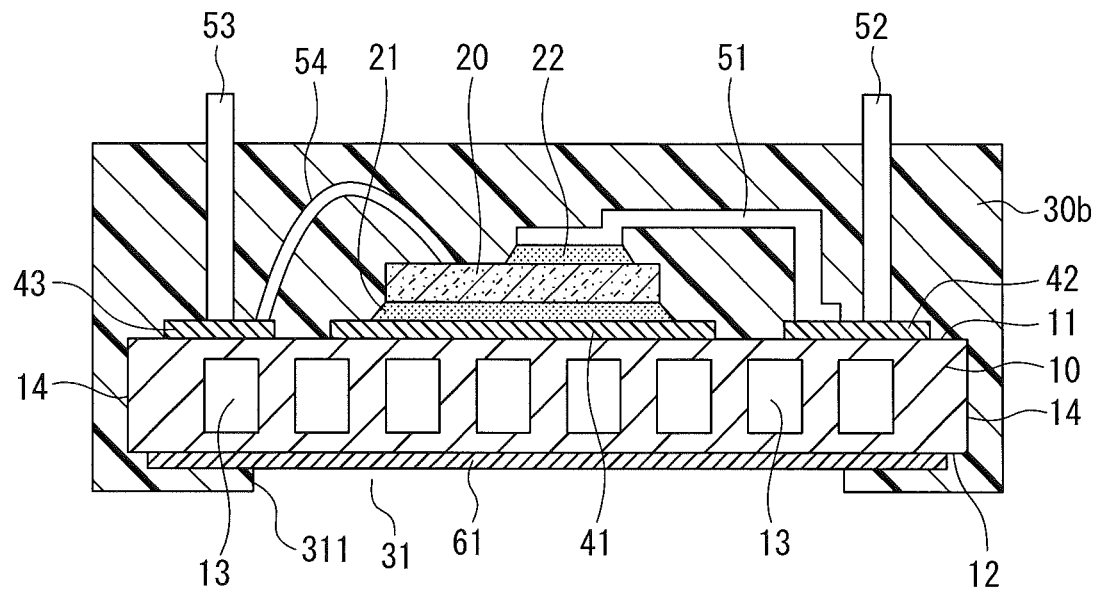
FIG. 9 is a cross-sectional view of a basic structure of a semiconductor device according to a fourth modification of the first embodiment.

As illustrated in FIG. 9, a semiconductor device according to a fourth modification of the first embodiment of the present invention is different from the second modification of the first embodiment in that a seal member 30b extends through the two opposite side faces 14 and further covers a peripheral portion defined on a peripheral area of the second main face 12. Specifically, the seal member 30b extends to cover a peripheral area of the buffer film 61, defining an opening 31 exposing the surface of the buffer film 61. A border line of the opening 31 is surrounded by an inner edge 311 of the seal member 30b disposed on the buffer film 61, and the opening 31 exposes a part of the buffer film 61 at the bottom. In the fourth modification, overlapping or redundant description of the same elements, functions and effects as those of the second modification of the first embodiment will be omitted.

As illustrated in a cross-sectional view of FIG. 9, the opening 31 of the seal member 30b does not expose the second main face 12 but only exposes the surface of the buffer film 61 at the bottom. Specifically, the opening 31 exposes at least an area of the buffer film 61, the area corresponding to a location at which the semiconductor chip 20 is disposed, in a plan view. Two side wall faces of the buffer film 61, defined respectively at both end sides of a direction, along which the plurality of coolant-passages 13 is arrayed, are sealed with the seal member 30b. The opening 31 has an inner edge 311 located on the surface of the buffer film 61. A border line of the opening 31 is surrounded by an inner edge 311 of the seal member 30b disposed on the buffer film 61. Thus, the seal member 30b extends from the first main face 11 and reaches the second main face 12 to cover a peripheral portion of the second main face 12.

In the cross-sectional view of FIG. 9, although peeling may occur at the inner edge 311 of the seal member 30b, a border line of the inner edge 311 of the seal member 30b is located on the surface of the buffer film 61, defining the peripheral portion of the second main face 12, which is less affected by heat from the semiconductor chip 20. With the structure illustrated in FIG. 9, it is possible to suppress the peeling of the seal member 30b from the cooler 10 due to the difference in the coefficient of thermal expansion. Moreover, since the seal member 30b includes the opening 31 exposing at least the region of the buffer film 61 corresponding to a projected location of the semiconductor chip 20 in a plan view, the seal member 30b close to the second main face 12 is less affected by heat from the semiconductor chip 20. Therefore, since change in temperature of the seal member 30b close to the second main face 12 is reduced, the thermal stress due to the difference in the coefficient of thermal expansion is reduced.

According to the semiconductor device of the fourth modification of the first embodiment, the seal member 30b includes the opening 31 exposing the surface of the buffer film 61. With the structure of the fourth modification illustrated in FIG. 9, the surface of the buffer film 61 exposed by the opening 31 can be bonded to another circuit component or element that needs cooling. The buffer film 61 is directly bonded to the cooler 10 where a coolant flows. Therefore, when another component, which may generate heat by driving the semiconductor device of the fourth modification, is bonded to the surface of the buffer film 61, it is possible to enhance cooling performance of the entire system.

Fifth Modification

Figure 10:
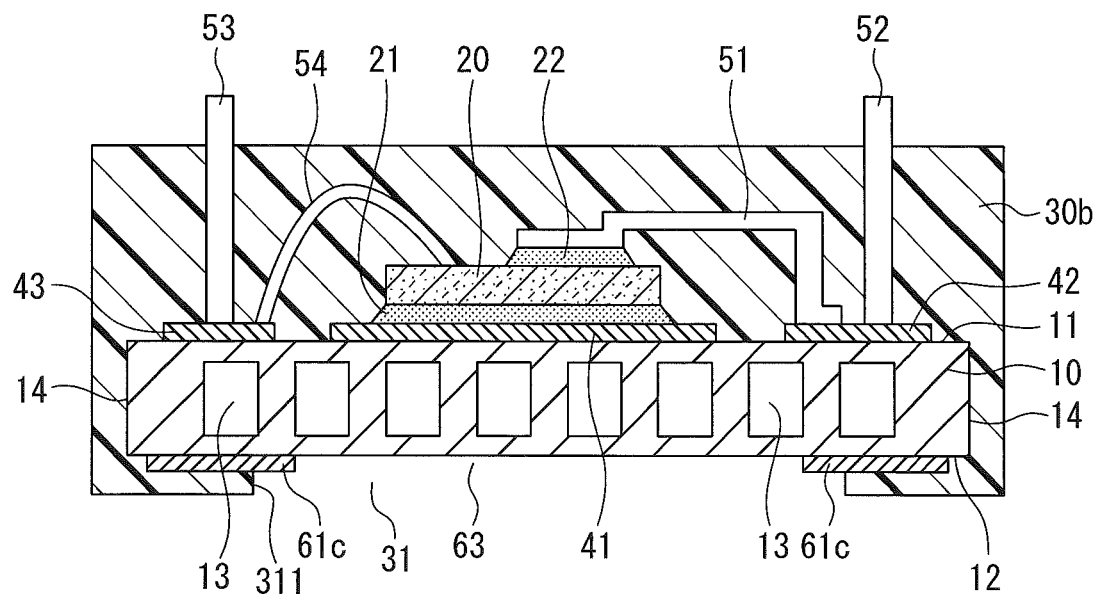
FIG. 10 is a cross-sectional view of a basic structure of a semiconductor device according to a fifth modification of the first embodiment.

As illustrated in FIG. 10, a semiconductor device according to a fifth modification of the first embodiment of the present invention is different from the fourth modification of the first embodiment in that a buffer film 61c has a first window 63 exposing a part of the second main face 12 of the cooler 10. The first window 63 of the buffer film 61c is provided inside the opening 31, which is recited in the fourth modification (hereinafter called the "second window 31"), of the seal member 30b in a plan view. In the fifth modification of the first embodiment, overlapping or redundant description of the same elements, functions and effects as those of the fourth modification of the first embodiment will be omitted.

Because an area of the second window 31 is larger than the first window 63, the second window 31 exposes the surface of the buffer film 61c in which the first window 31 is cut. That is, the first window 63 is provided in a part of an area of the buffer film 61c, the area being exposed by the second window 31. The first window 63 exposes at least an area of the second main face 12 corresponding to a projected area of the semiconductor chip 20 in a plan view. That is, the buffer film 61c can be selectively provided on a peripheral portion excluding a central part of the second main face 12.

Side wall faces of the buffer film 61c on both end sides of a direction, along which the plurality of coolant-passages 13 is arrayed, are covered by the seal member 30b. The inner edge 311 of the second window 31 is located on a surface of the buffer film 61c, as a border line of the window 31 is surrounded by an inner edge 311 of the seal member 30b disposed on the buffer film 61. Thus, the seal member 30b extends from the first main face 11 and reaches the second main face 12 via the two opposite side faces 14 to cover the peripheral portion so as to exclude the central part of the second main face 12.

According to the semiconductor device of the fifth modification of the first embodiment, the buffer film 61c includes the first window 63 exposing at least the area of the second main face 12 corresponding to a projected area of the semiconductor chip 20 in a plan view. With the structure illustrated in FIG. 10, the buffer film 61c on the second main face 12 side is less affected by heat from the semiconductor chip 20 than in the fourth modification of the first embodiment. Since change in temperature of the buffer film 61c is reduced, the thermal stress due to the difference in the coefficient of thermal expansion is suppressed, thereby improving reliability of the semiconductor device.

In addition, another circuit component or element that needs cooling can be directly bonded to the second main face 12 of the cooler 10 exposed by the first window 63 of the buffer film 61c. It is therefore possible to further enhance the cooling performance of the entire system.

Second Embodiment

Figure 11:
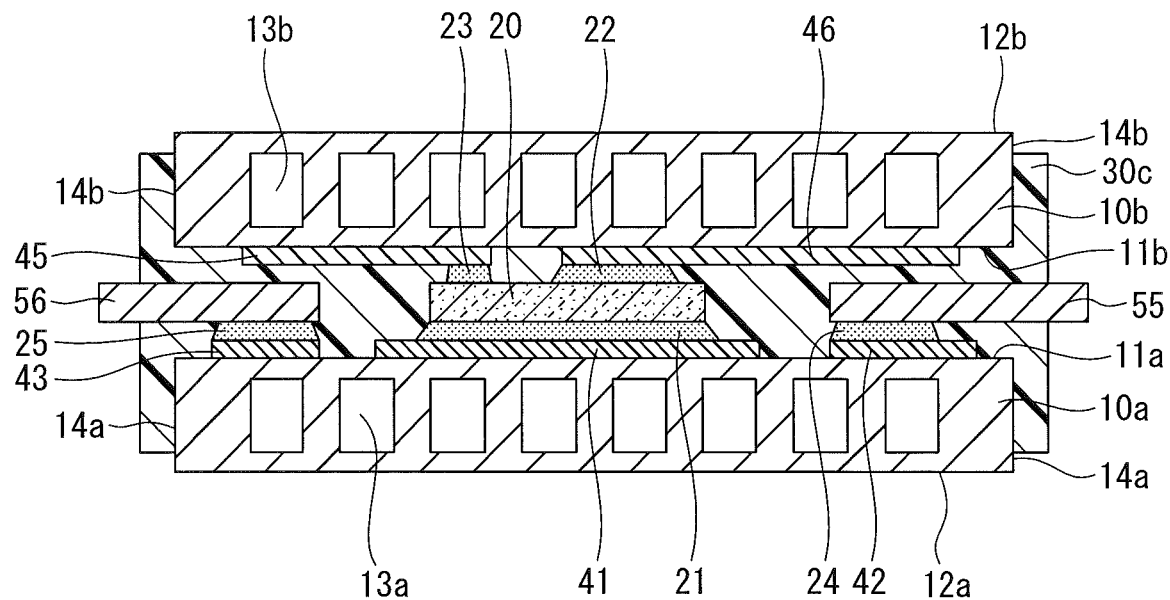
FIG. 11 is a cross-sectional view of a basic structure of a semiconductor device according to a second embodiment of the present invention.

As illustrated in FIG. 11, a semiconductor device according to a second embodiment of the present invention is different from the first embodiment in that a first cooler 10a and a second cooler 10b are bonded so as to sandwich both main faces of the semiconductor chip 20. As with the first embodiment, the semiconductor device of the second embodiment includes the semiconductor chip 20 and a seal member 30c sealing the semiconductor chip 20. However, as illustrated in FIG. 11, the seal member 30c seals the semiconductor chip 20 in a different way from the first embodiment, as described later. In the second embodiment, overlapping or redundant description of the same elements, functions and effects as those of the first embodiment will be omitted.

The first cooler 10a, disposed at lower portion, is made of ceramics and includes a first main face 11a and a second main face 12a. The second main face 12a is parallel and opposite to the first main face 11a. The first cooler 10a is rectangular flat-plate in shape, for example. The first cooler 10a includes a plurality of first coolant-passages 13a. The plurality of first coolant-passages 13a may penetrate through a first layer provided between the first main face 11a and the second main face 12a. The plurality of first coolant-passages 13a extends in a direction perpendicular to the sheet of FIG. 11 and is opened at both ends of the extending direction. With the rectangular flat-plate shape, the ends of the first cooler 10a is defined by two opposite first side faces 14a perpendicular to the first main face 11a and the second main face 12a. The two opposite first side faces 14a faces at both ends of a direction, along which the plurality of first coolant-passages 13a is arrayed (i.e., a horizontal direction in FIG. 11). The plurality of first coolant-passages 13a is arranged in line parallel to the first main face 11a.

The second cooler 10b, disposed at upper portion, is made of ceramics and includes a third main face 11b parallel to the first main face 11a, and a fourth main face 12b, being parallel and opposite to third main face 11b. The second cooler 10b is rectangular flat-plate in shape, for example. The second cooler 10b includes a plurality of second coolant-passages 13b. The plurality of second coolant-passages 13b may penetrate through a second layer provided between the third main face 11b and the fourth main face 12b. The plurality of second coolant-passages 13b extends in a direction perpendicular to the sheet of FIG. 11 and is opened at both ends of the extending direction. With the rectangular flat-plate shape, the ends of second cooler 10b is defined by two opposite second side faces 14b perpendicular to the third main face 11b and the fourth main face 12b. The two opposite second side faces 14b faces at both ends of a direction, along which the plurality of second coolant-passages 13b is arrayed (i.e., a horizontal direction in FIG. 11). The plurality of second coolant-passages 13b is arranged in line in an array direction of the plurality of first coolant-passages 13a.

The ceramics forming the first cooler 10a and the second cooler 10b is selectable from SiC, $Si_3N_4$, AlN, $Al_2O_3$, $TiO_2$, and $ZrO_2$.

Each of the chip-mount pattern 41, the first terminal-joint pattern 42 and the second terminal-joint pattern 43, in the semiconductor device of the second embodiment, is a first conductive-pattern layer forming a surface interconnecting circuit bonded to the first main face 11a. To the upper surface of the first terminal-joint pattern 42, one end side of a first main terminal 55 is bonded by a jointing material 24. The other end side of the first main terminal 55 protrudes horizontally from the side wall of the seal member 30c so that the other end side of the first main terminal 55 is bared from the seal member 30c. To the upper surface of the second terminal-joint pattern 43, one end side of a second main terminal 56 is bonded by a jointing material 25. The other end side of the second main terminal 56 is bared from the seal member 30c. Each of the first main terminal 55 and the second main terminal 56 is a conductor plate or a conductor bar made of metal, such as Cu, copper alloy and the like. The first main terminal 55 and the second main terminal 56 may be plated with Ni, Au or the like. The jointing materials 24 and 25 may include solder, conductive adhesive, sintered metal such as Ag nanoparticles, and the like.

As illustrated in FIG. 11, to the third main face 11b of the second cooler 10b, second conductive-pattern layers 45 and 46 are bonded. Similarly to the chip-mount pattern 41, the first terminal-joint pattern 42 and the second terminal-joint pattern 43, the second conductive-pattern layers 45 and 46 are made of Cu, for example, and are bonded to the second cooler 10b by DCB using eutectic bonding, AMB or the like. Instead of copper, the second conductive-pattern layers 45 and 46 may be made of a conductive metal, such as copper alloy, Al or aluminum alloy. In addition, the second conductive-pattern layers 45 and 46 may be plated with Ni, Au or the like.

For example, the second conductive-pattern layer 45 has one end side bonded to the control electrode of the semiconductor chip 20 by a jointing material 23, and the other end side bonded to a control terminal (not illustrated). The second conductive-pattern layer 46 has one end side connected to the first main electrode of the semiconductor chip 20 by the jointing material 22, and the other end side electrically connected to the first main terminal 55.

Thus, the upper surface of the semiconductor chip 20 is bonded to the third main face 11b of the second cooler 10b via the jointing materials 22, 23 and the second conductive-pattern layers 45, 46. The lower surface of the semiconductor chip 20 is bonded to the first main face 11a of the first cooler 10a via the jointing material 21 and the chip-mount pattern 41. Since the heat from the semiconductor chip 20 may be radiated with the coolant flowing in the first cooler 10a and the second cooler 10b on the lower and upper surfaces, respectively, cooling performance can be high.

The seal member 30c seals the semiconductor chip 20, the first conductive-pattern layers, and the second conductive-pattern layers 45 and 46. As illustrated in FIG. 11, the seal member 30c covers a continuous region on the surface of the first cooler 10a extending from the first main face 11a to at least a part of the two opposite first side faces 14a in a cross-sectional direction, which is taken perpendicular to the longitudinal direction of the plurality of first coolant-passages 13a and the plurality of second coolant-passages 13b. Similarly, the seal member 30c covers a continuous region on the surface of the second cooler 10b extending from the third main face 11b to at least a part of the two opposite second side faces 14b.

The seal member 30c is provided over a region excluding end portions of the first cooler 10a and the second cooler 10b, which extend in a direction perpendicular to the sheet of FIG. 11. In the direction perpendicular to the sheet of FIG. 11, manifold-assemblies are scheduled to be connected to the first cooler 10a and the second cooler 10b to allow the coolant to flow in each of the plurality of first coolant-passages 13a and the plurality of second coolant-passages 13b.

The seal member 30c includes a thermo-setting resin and a filler. For example, the thermo-setting resin may be an epoxy resin or a resin containing epoxy as a principal component. For example, the filler may be inorganic insulated powder such as silica. A coefficient of thermal expansion of the seal member 30c is adjustable by changing addition amount of the filler to the resin. As the addition amount of the filler is larger, the coefficient of thermal expansion is smaller. An excessive amount of the filler, however, has an undesirable effect, such as insulating performance deterioration and mechanical weakness. For this reason, the coefficient of thermal expansion of the seal member 30c may be adjusted in a range of $13 \times 10^{-6}$ to $30 \times 10^{-6}$ (/K), for example. However, these values are larger than the coefficient of thermal expansion of the ceramics. The coefficient of thermal expansion of the seal member 30c is measured in accordance with JIS K 7197, in a range between 20 degree centigrade and 250 degree centigrade.

According to the semiconductor device of the second embodiment, the seal member 30c covers the first main face 11a and at least a part of the two opposite first side faces 14a of the first cooler 10a, and covers the third main face 11b and at least a part of the two opposite second side faces 14b of the second cooler 10b. With the structure illustrated in FIG. 11, it is possible to suppress warpage of the entire module as well as crack and peeling by warping stress due to a difference in the coefficient of thermal expansion between the seal member 30c and the ceramics. In contrast, the crack and peeling may occur when the seal member 30c covers only the first main face 11a and the third main face 11b. Moreover, the two opposite first side faces 14a and the two opposite second side faces 14b are located away from the semiconductor chip 20, thereby being less affected by heat from the semiconductor chip 20, which causes only a slight change in temperature. It is therefore possible to suppress the peeling and crack due to the difference in the coefficient of thermal expansion by a configuration such that the ends of the seal member 30c, which serves as starting points at which the peeling and crack may occur, are provided on the two opposite first side faces 14a and on the two opposite second side faces 14b.

First Modification

Figure 12:
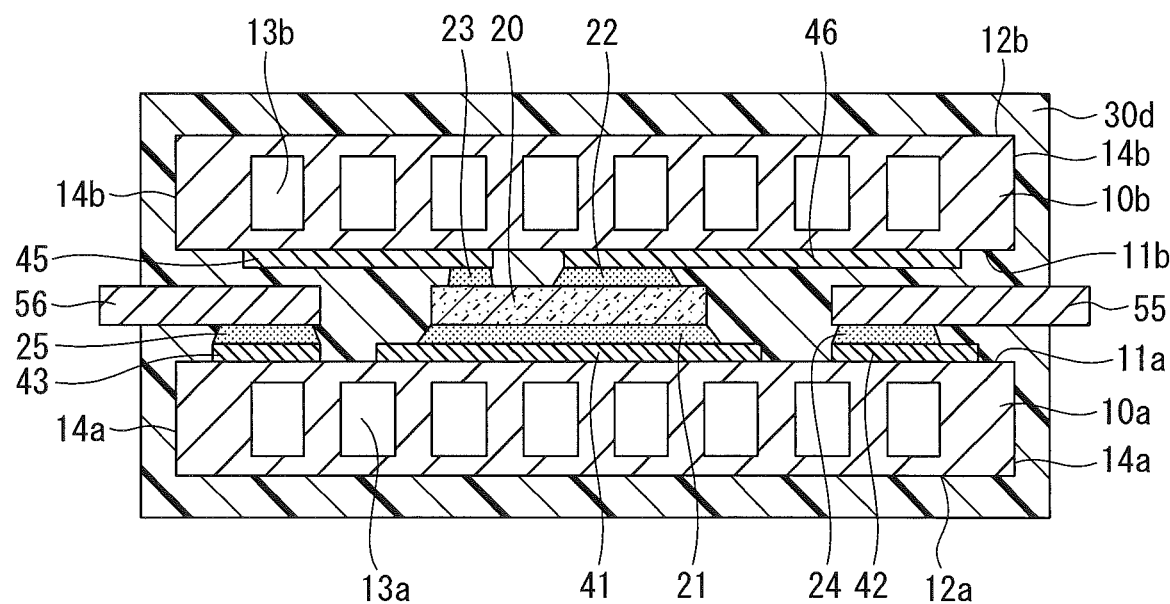
FIG. 12 is a cross-sectional view of a basic structure of a semiconductor device according to a first modification of the second embodiment.

As illustrated in FIG. 12, a semiconductor device according to a first modification of the second embodiment of the present invention is different from the second embodiment in that a seal member 30d reaches the second main face 12a and the fourth main face 12b. In the first modification, overlapping or redundant description of the same elements, functions and effects as those of the second embodiment will be omitted.

In FIG. 12, the seal member 30d covers all around the first main face 11a, the two opposite first side faces 14a and the second main face 12a of the first cooler 10a. Similarly, the seal member 30d covers all around the third main face 11b, the two opposite second side faces 14b and the fourth main face 12b of the second cooler 10b. That is, the seal member 30d surrounds entirely the first cooler 10a and the second cooler 10b in a cross-sectional direction, which is taken perpendicular to the longitudinal direction of the plurality of first coolant-passages 13a and the plurality of second coolant-passages 13b. The seal member 30d is a rectangular parallelepiped defined by two side surfaces facing the second main face 12a of the first cooler 10a and the fourth main face 12b of the second cooler 10b, respectively.

According to the semiconductor device of the first modification of the second embodiment, the seal member 30d surrounds entirely the first cooler 10a and the second cooler 10b in a cross-sectional direction, which is taken perpendicular to the longitudinal direction of the plurality of first coolant-passages 13a and the plurality of second coolant-passages 13b. Hence, the seal member 30d is continuously provided around the first cooler 10a and the second cooler 10b in a cross-sectional direction, which is taken perpendicular to the longitudinal direction, and has no ends which can be a starting point of peeling. Thus, according to the semiconductor device of the first modification of the second embodiment, it is possible to suppress crack and peeling of the seal member 30d from the first cooler 10a and the second cooler 10b due to the difference in the coefficient of thermal expansion.

As described above, according to the semiconductor device of the first modification of the second embodiment, the seal member 30d surrounds entirely the first cooler 10a and the second cooler 10b in a cross-sectional direction, which is taken perpendicular to the longitudinal direction of the plurality of first coolant-passages 13a and the plurality of second coolant-passages 13b. With the structure illustrated in FIG. 12, even when the seal member 30d is partly peeled from the first cooler 10a and the second cooler 10b, a relative location of the seal member 30d with respect to the first cooler 10a and the second cooler 10b can be maintained. Therefore, according to the semiconductor device of the first modification of the second embodiment, it is possible to reduce defect such as insulation failure or conduction failure due to breakage or warpage.

An exemplary method for manufacturing the semiconductor device according to the first modification of the second embodiment, will be described with reference to FIGS. 13 to 16:

First, on the first main face 11a of the first cooler 10a, the first conductive-pattern layer including a circuit pattern, such as the chip-mount pattern 41, the first terminal-joint pattern 42 and the second terminal-joint pattern 43, is formed in a similar configuration illustrated in FIG. 12. On the third main face 11b of the second cooler 10b, a conductive-pattern layer including a circuit pattern, such as the second conductive-pattern layers 45 and 46, is formed.

Figure 13:
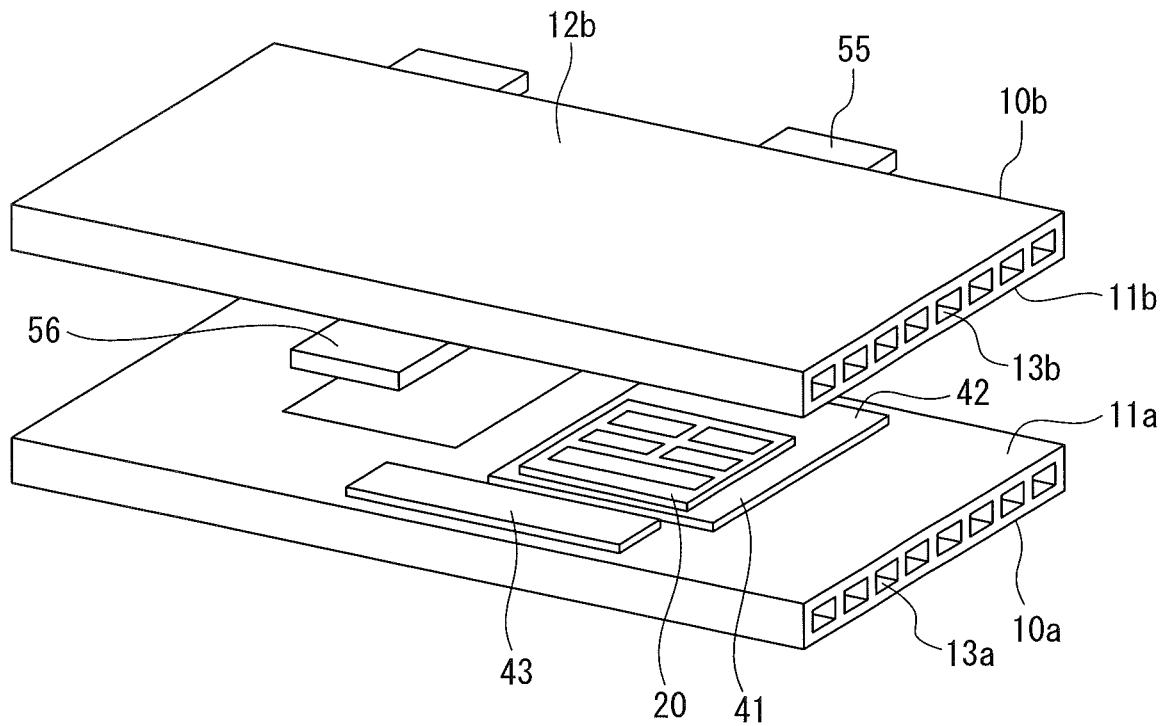
FIG. 13 is a perspective view illustrating a manufacturing process of the semiconductor device according to the first modification of the second embodiment.

Next, as illustrated in FIG. 13, the semiconductor chip 20 is mounted on the chip-mount pattern 41 of the first cooler 10a, such that the lower surface of the semiconductor chip 20, at which the second main electrode of the semiconductor element implementing the semiconductor chip 20 is located, is bonded to the chip-mount pattern 41 by the jointing material 21 (not illustrated in FIG. 13). Then, in a similar configuration illustrated in FIG. 12, the jointing materials 22 and 23 (not illustrated in FIG. 13) are disposed on the upper surface of the semiconductor chip 20. The first main terminal 55 is bonded to the upper surface of the first terminal-joint pattern 42 by the jointing material 24 (not illustrated in FIG. 13), and the second main terminal 56 is bonded to the upper surface of the second terminal-joint pattern 43 by the jointing material 25 (not illustrated in FIG. 13), as also illustrated in FIG. 12. Although the chip-mount pattern 41 is illustrated as if the chip-mount pattern 41 continuously connected to the first terminal-joint pattern 42 in FIG. 13, the conductive-pattern layer forming each circuit pattern may be appropriately delineated depending on design requirements prescribed by types of semiconductor elements or circuitry.

Figure 14:
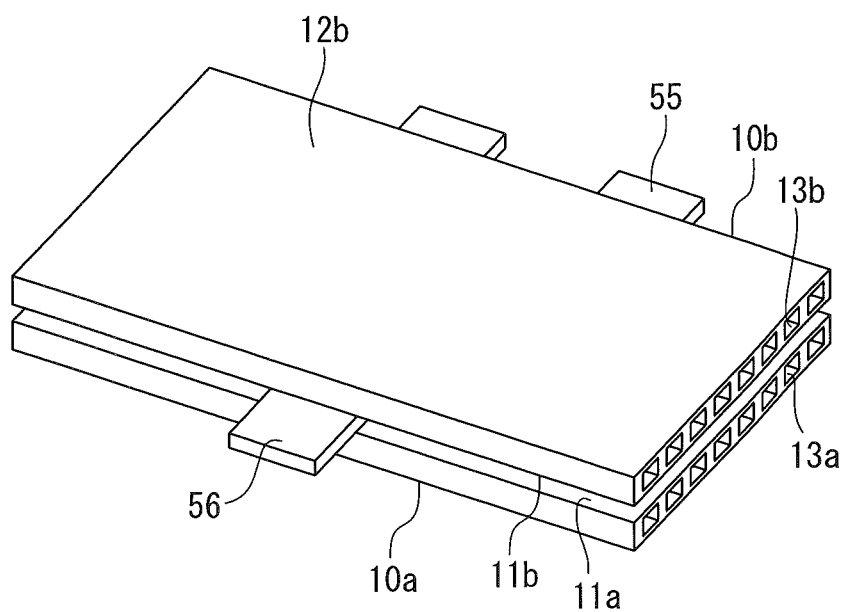
FIG. 14 is a perspective view illustrating a manufacturing process of the semiconductor device according to the first modification of the second embodiment.

Next, as illustrated in FIG. 14, the first cooler 10a and the second cooler 10b are stacked such that the patterns of the first conductive-pattern layers on the first main face 11a face to the patterns of the second conductive-pattern layers on the third main face 11b. As a result, both main faces of the semiconductor chip 20 (not illustrated in FIG. 14) are sandwiched in between the first main face 11a of the first cooler 10a and the third main face 11b of the second cooler 10b. The electrodes on the upper surface of the semiconductor chip 20 (not illustrated in FIG. 14) are bonded to the second conductive-pattern layers 46 and 45 (not illustrated in FIG. 14) by the jointing material 22 and 23 (not illustrated in FIG. 14), respectively. The ends of the plate-shaped terminals, such as the first main terminal 55 and the second main terminal 56, horizontally protrude outward from the both sides of the first cooler 10a and the second cooler 10b in a direction, along which the plurality of first coolant-passages 13a and the plurality of second coolant-passages 13b is arrayed.

Figure 15:
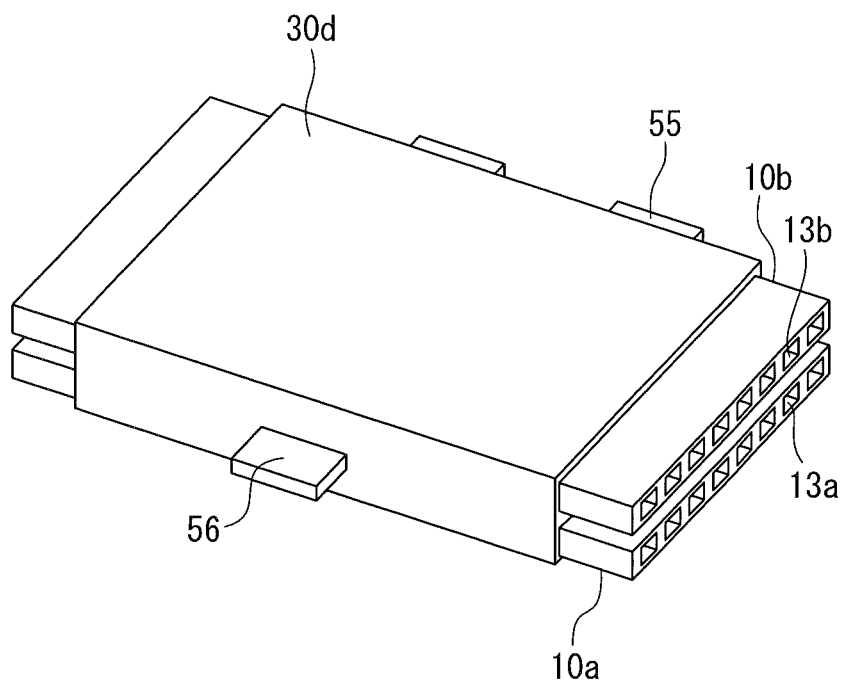
FIG. 15 is a perspective view illustrating a manufacturing process of the semiconductor device according to the first modification of the second embodiment.

Next, as illustrated in FIG. 15, the first cooler 10a and the second cooler 10b, which are bonded to each other, are placed in a mold. The seal member 30d before thermal curing is poured to cover the first cooler 10a and the second cooler 10b excluding the both end portions of the plurality of first coolant-passages 13a and the plurality of second coolant-passages 13b. By molding the seal member 30d, tip portions of the plurality of first coolant-passages 13a, tip portions of the plurality of second coolant-passages 13b, and tip portions of the plate-shaped terminals such as the first main terminal 55 and the second main terminal 56 protrude from the seal member 30d, and then, these tip portions are exposed to the outside from the seal member 30d.

Figure 16:
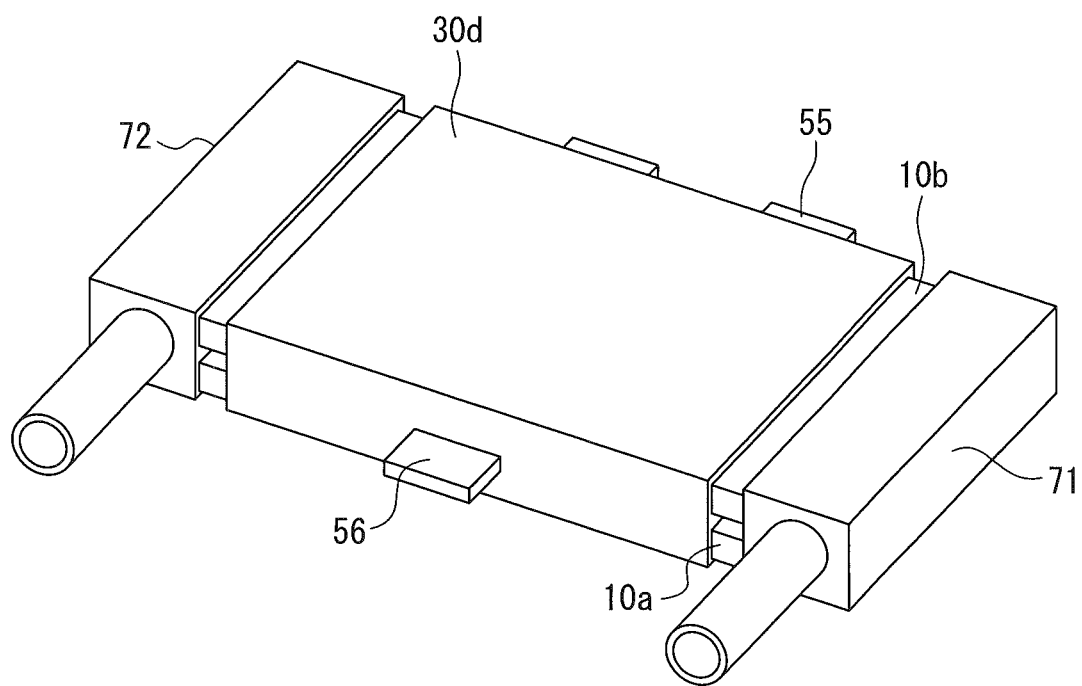
FIG. 16 is a perspective view illustrating a manufacturing process of the semiconductor device according to the first modification of the second embodiment.

As illustrated in FIG. 16, to the both end portions of the plurality of first coolant-passages 13a and the plurality of second coolant-passages 13b (not illustrated in FIG. 16) of the semiconductor device manufactured by the above-described method, manifold-assemblies 71 and 72 are connected. With this connection, windows of the both end portions of the plurality of first coolant-passages 13a and the plurality of second coolant-passages 13b are connected to an external circulating system to allow the coolant to flow in one direction through the plurality of first coolant-passages 13a and the plurality of second coolant-passages 13b.

Second Modification

Figure 17:
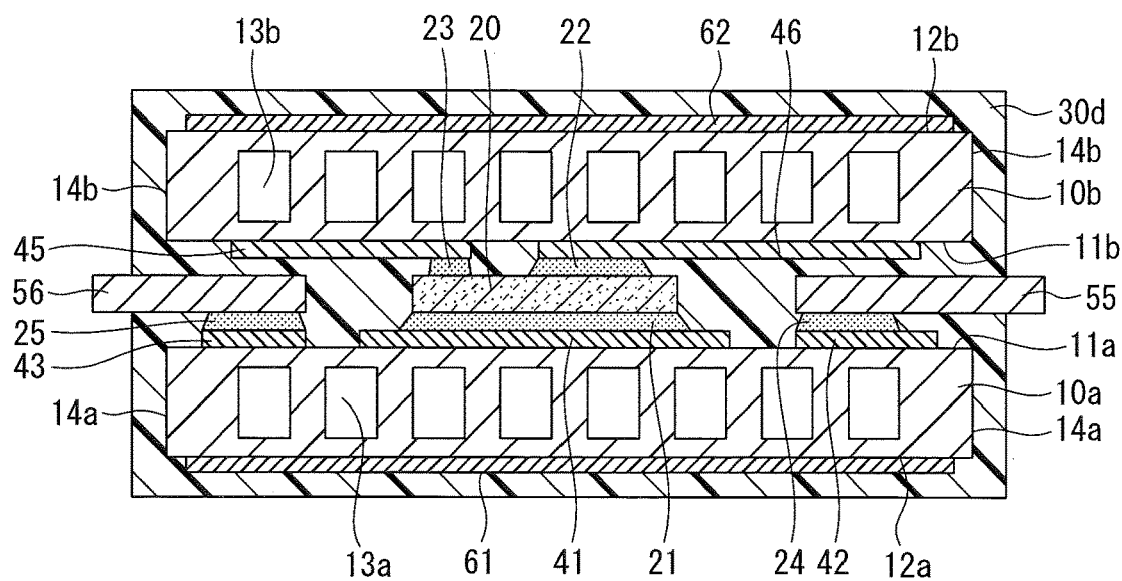
FIG. 17 is a cross-sectional view of a basic structure of a semiconductor device according to a second modification of the second embodiment.

As illustrated in FIG. 17, a semiconductor device according to a second modification of the second embodiment of the present invention is different from the first modification of the second embodiment illustrated in FIGS. 12 to 16 in that a first buffer film 61 and a second buffer film 62 are provided. The first buffer film 61 is bonded to the second main face 12a of the first cooler 10a. The second buffer film 62 is bonded to the fourth main face 12b of the second cooler 10b. In the second modification, overlapping or redundant description of the same elements, functions and effects as those of the first and second embodiments and modified examples thereof will be omitted.

The first buffer film 61 extends from one end to the other of the second main face 12a in a direction, along which the plurality of first coolant-passages 13a is arrayed, and bonds the second main face 12a and the seal member 30d. The second buffer film 62 extends from one end to the other of the fourth main face 12b in a direction, along which the plurality of second coolant-passages 13b, and bonds the fourth main face 12b and the seal member 30d.

Although each of the first buffer film 61 and the second buffer film 62 looks like a single film in FIG. 17, each of the first buffer film 61 and the second buffer film 62 may be divided into multiple areas. The first buffer film 61 and the second buffer film 62 preferably have a thickness of 0.1 millimeter or more and 5.0 millimeters or less, more preferably, 0.2 millimeter or more and 2.5 millimeters or less.

The first buffer film 61 and the second buffer film 62 are made of metal having larger coefficient of thermal expansion than that of ceramics, which is the material of the first cooler 10a and the second cooler 10b. More preferably, the coefficient of thermal expansion of the first buffer film 61 and the second buffer film 62 may be in a range of $13 \times 10^{-6}$ to $25 \times 10^{-6}$ (/K). The first buffer film 61 and the second buffer film 62 are made of Cu or copper alloy, for example, and are bonded to the second main face 12a and the fourth main face 12b, respectively, by DCB using eutectic bonding, AMB or the like. The first buffer film 61 and the second buffer film 62 can be formed of the same material as that of the chip-mount pattern 41, the first terminal-joint pattern 42, the second terminal-joint pattern 43, and the second conductive-pattern layers 45 and 46. Instead of Cu or copper alloy, the first buffer film 61 and the second buffer film 62 may be made of Al, Al alloy, Ni, Ni alloy, stainless steel or the like. In addition, the first buffer film 61 and the second buffer film 62 may be plated with Ni, Au or the like.

According to the semiconductor device of the second modification of the second embodiment, the adhesion between the first buffer film 61 and the resin of the seal member 30d is higher than the adhesion between the ceramics of the first cooler 10a and the resin of the seal member 30d. Similarly, the adhesion between the second buffer film 62 and the resin of the seal member 30d is higher than the adhesion between the ceramics of the second cooler 10b and the resin of the seal member 30d. With these features, the seal member 30d can be more firmly bonded to the first cooler 10a and the second cooler 10b via the first buffer film 61 and the second buffer film 62, respectively.

Moreover, according to the semiconductor device of the second modification of the second embodiment, the first buffer film 61 having larger coefficient of thermal expansion than that of the first cooler 10a is disposed on the second main face 12a of the first cooler 10a. With this first buffer film 61, it is possible to reduce the thermal stress on the boundary between the seal member 30d and the second main face 12a of the first cooler 10a due to the difference in coefficient of thermal expansion between the seal member 30d and the first cooler 10a.

Similarly, according to the semiconductor device of the second modification of the second embodiment, the second buffer film 62 having larger coefficient of thermal expansion than that of the second cooler 10b is disposed on the fourth main face 12b of the second cooler 10b. With this second buffer film 62, it is possible to reduce the thermal stress on the boundary between the seal member 30d and the fourth main face 12b of the second cooler 10b due to the difference in coefficient of thermal expansion between the seal member 30d and the second cooler 10b.

Third Modification

Figure 18:
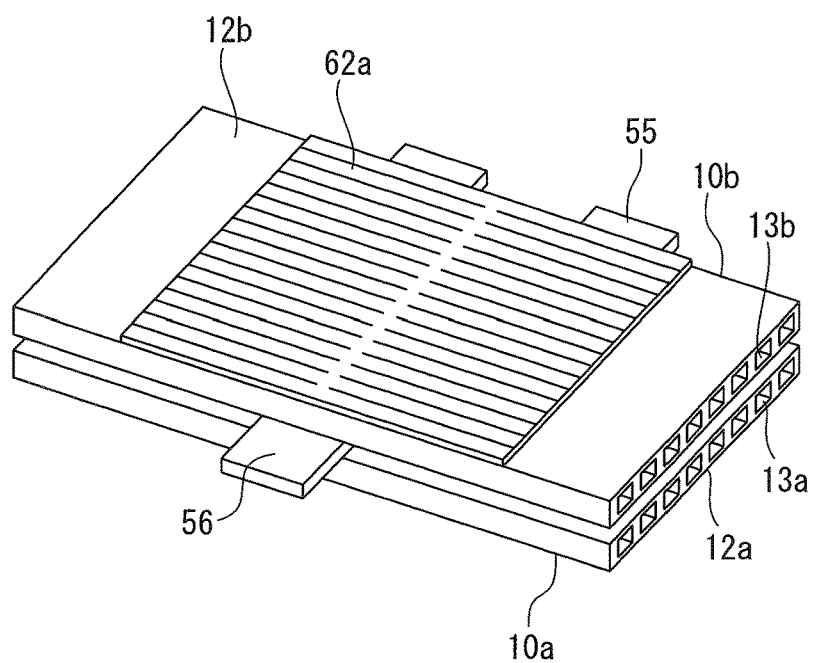
FIG. 18 is a perspective view of an example of a basic structure of a semiconductor device according to a third modification of the second embodiment though a seal member is not illustrated.

As illustrated in FIG. 18, a semiconductor device according to a third modification of the second embodiment of the present invention is different from the second modification of the second embodiment in that a first buffer film (not illustrated in FIG. 18) and a second buffer film 62a, each of which has a plurality of slits, are provided. Since the second buffer film 62a is disposed on the fourth main face 12b of the second cooler 10b, the second buffer film 62a is illustrated in FIG. 18. On the other hand, the first buffer film is not illustrated in FIG. 18 because the first buffer film is disposed on the second main face 12a of the first cooler 10a. In the third modification of the second embodiment, overlapping or redundant description of the same elements, functions and effects as those of the second modification of the second embodiment will be omitted.

Although the semiconductor device includes the seal member 30d (See FIG. 17), the seal member 30d is not illustrated in FIG. 18 in order to illustrate the plurality of slits on a surface of the second buffer film 62a. Because the first buffer film has the same structure as that of the second buffer film 62a, the illustration of the first buffer film is omitted in FIG. 18.

Each of the first buffer film and the second buffer film 62a includes, on the surface that adheres to the seal member 30d, the plurality of slits parallel to the longitudinal direction of the plurality of first coolant-passages 13a and the plurality of second coolant-passages 13b. Although the illustration is omitted, each of the plurality of slits may be first grooves that are cut inward from a first opposite plane of the first buffer film, or the bottom of the first buffer film, the first opposite plane is opposite to a first contacting plane of the first buffer film, the first contacting plane being contacting to the second main face 12a. Alternatively, each of the plurality of slits may be holes penetrating from the first opposite plane to a back side of the first buffer film. Similarly, each of the plurality of slits may be second grooves that are cut inward from a second opposite plane of the second buffer film 62a, or the top the second buffer film 62a, the second opposite plane is opposite to a second contacting plane of the second buffer film 62a, the second contacting plane being contacting to the fourth main face 12b as illustrated in FIG. 18. Alternatively, each of the plurality of slits may be holes penetrating from the second opposite plane to a back side of the second buffer film 62a. The plurality of slits of each of the first buffer film and the second buffer film 62a causes an anchor effect, thereby enhancing the adhesion to the seal member 30d.

According to the semiconductor device of the third modification of the second embodiment, the adhesion between the seal member 30d and each of the first buffer film and the second buffer film 62a is higher than the adhesion between the seal member 30d and the flat buffer film. With this feature, the seal member 30d can be more firmly bonded to the first cooler 10a and the second cooler 10b via the first buffer film and the second buffer film 62a, respectively.

Figure 19:
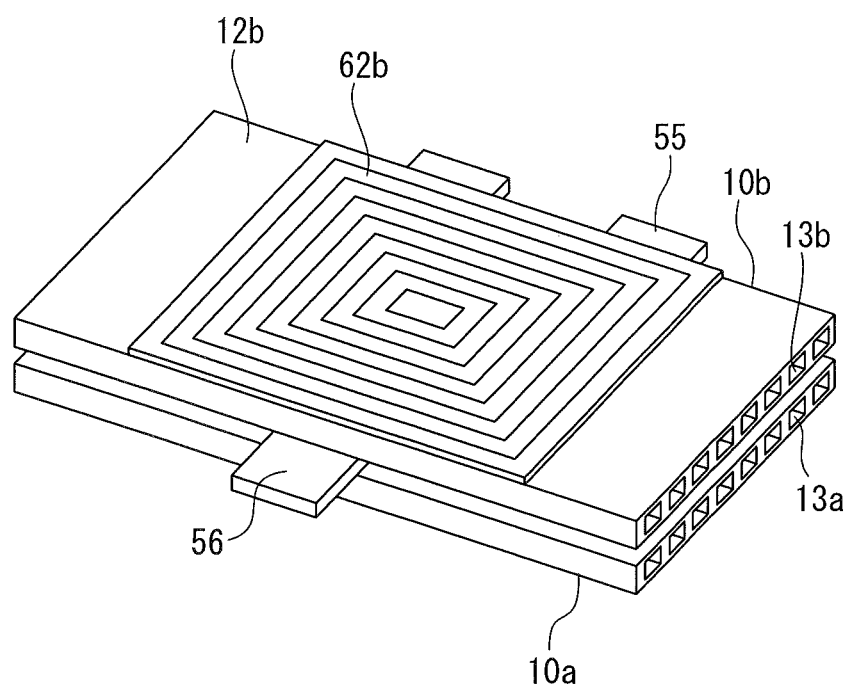
FIG. 19 is a perspective view of another example of the basic structure of the semiconductor device according to another third modification of the second embodiment though a seal member is not illustrated.

A pattern of the slits of the first buffer film and the second buffer film 62a is not limited to a pattern parallel to the plurality of first coolant-passages 13a and the plurality of second coolant-passages 13b. As illustrated in FIG. 19, for example, a second buffer film 62b having a plurality of homothetic rectangular slits, which are arranged coaxially and periodically, may be employed. Although the illustration is omitted, the first buffer film, which shall be disposed on the second main face 12a of the first cooler 10a, may have a plurality of homothetic rectangular slits being arranged coaxially and periodically.

Fourth Modification

Figure 20:
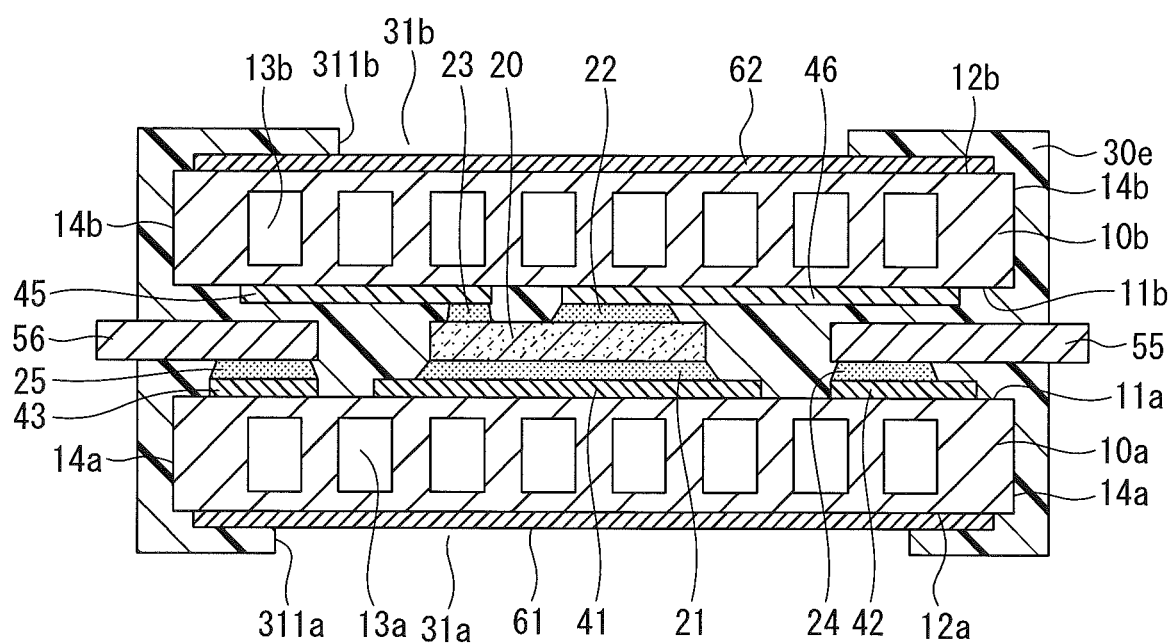
FIG. 20 is a cross-sectional view of a basic structure of a semiconductor device according to a fourth modification of the second embodiment.

As illustrated in FIG. 20, a semiconductor device according to a fourth modification of the second embodiment of the present invention is different from the second modification illustrated in FIG. 17 in that a seal member 30e has, on a lower surface, a lower opening 31a exposing the first buffer film 61 and has, on an upper surface, an upper opening 31b exposing the second buffer film 62. In the fourth modification, overlapping, redundant description of the same elements, functions and effects as those of the second modification of the second embodiment will be omitted.

The lower opening 31a does not expose the second main face 12a but only exposes the surface of the first buffer film 61. Specifically, the lower opening 31a exposes at least an area of the first buffer film 61 corresponding to a projected area of the semiconductor chip 20 in a plan view. Both sides of the first buffer film 61 in a direction, along which the plurality of first coolant-passages 13a is arrayed, are sealed with the seal member 30e. The lower opening 31a has an inner edge 311a located on the surface of the first buffer film 61, as a border line of the lower opening 31a is surrounded by an inner edge 311 of the seal member 30e disposed on the first buffer film 61. Thus, the seal member 30e extends from the first main face 11a and reaches the second main face 12a to cover a peripheral portion of the second main face 12a.

Similarly, the upper opening 31b does not expose the fourth main face 12b but only exposes the surface of the second buffer film 62. Specifically, the upper opening 31b exposes at least an area of the second buffer film 62 corresponding to a projected area of the semiconductor chip 20 in a plan view. Both sides of the second buffer film 62 in a direction, along which the plurality of second coolant-passages 13b is arrayed, are sealed with the seal member 30e. The upper opening 31b has an inner edge 311b located on the surface of the second buffer film 62. Thus, the seal member 30e extends from the third main face 11b and reaches the fourth main face 12b to cover a peripheral portion of the fourth main face 12b.

As described above, although peeling may occur at the inner edge 311a of the lower opening 31a, the inner edge 311a on the surface of the first buffer film 61 is located on the peripheral portion of the second main face 12a, which is less affected by heat from the semiconductor chip 20. Similarly, the inner edge 311b of the upper opening 31b on the surface of the second buffer film 62 is located on the peripheral portion of the fourth main face 12b. With the structure illustrated in FIG. 20, it is possible to suppress the peeling of the seal member 30e due to the difference in the coefficient of thermal expansion between the seal member 30e and each of the first cooler 10a and the second cooler 10b. Moreover, since the seal member 30e includes the lower opening 31a and the upper opening 31b, the seal member 30e is less affected by heat from the semiconductor chip 20. Therefore, since change in temperature of the seal member 30e is reduced, the thermal stress due to the difference in the coefficient of thermal expansion is reduced, thereby suppressing the peeling.

The seal member 30e has the lower opening 31a exposing the surface of the first buffer film 61 and has the upper opening 31b exposing the surface of the second buffer film 62. With the structure pertaining to fourth modification of the second embodiment of the present invention, the exposed surfaces of the first buffer film 61 and the second buffer film 62 can be bonded to another circuit component or element that needs cooling. Therefore, the first buffer film 61 is directly bonded to the first cooler 10a where a coolant flows. Hence, by bonding another component, which may generate heat, to the first buffer film 61, it is possible to further enhance the cooling performance of the entire system. Similarly, the second buffer film 62 is directly bonded to the second cooler 10b where a coolant flows. Hence, by bonding another component, which may generate heat, to the second buffer film 62, it is possible to further enhance the cooling performance of the entire system.

Fifth Modification

Figure 21:
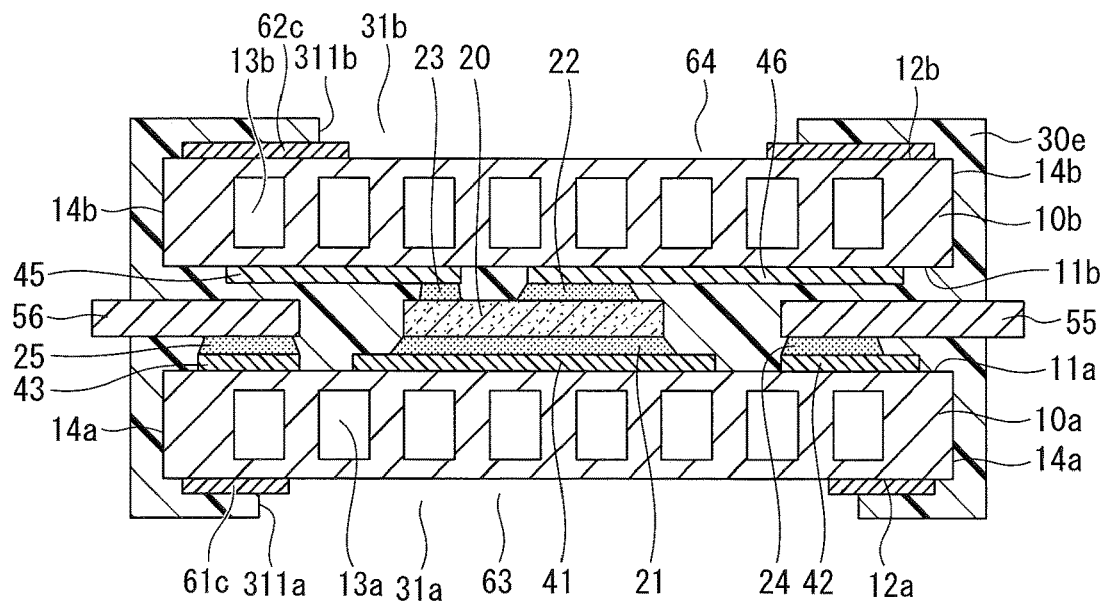
FIG. 21 is a cross-sectional view of a basic structure of a semiconductor device according to a fifth modification of the second embodiment.

As illustrated in FIG. 21, a semiconductor device according to a fifth modification of the second embodiment of the present invention is different from the fourth modification of the second embodiment in that a first buffer film 61c has a first window 63 exposing a part of the second main face 12a of the first cooler 10a, and a second buffer film 62c has a third window 64 exposing a part of the fourth main face 12b of the second cooler 10b. The first window 63 of the first buffer film 61c is provided inside the lower opening 31a, which is recited in the fourth modification (hereinafter called the "second window 31a"), of the seal member 30e in a plan view. Similarly, the third window 64 of the second buffer film 62c is provided inside the upper opening 31b, which is recited in the fourth modification (hereinafter called the "fourth window 31b"), of the seal member 30e in a plan view. In the fifth modification, overlapping or redundant description of the same elements, functions and effects as those of the fourth modification of the second embodiment will be omitted.

Because an area of the second window 31a is larger than the first window 63, the second window 31a exposes the surface of the first buffer film 61c in which the first window 31a is cut. That is, the first window 63 is provided in a part of an area of the first buffer film 61c, the area being exposed by the second window 31a. The first window 63 exposes at least an area of the second main face 12a corresponding to a projected area of the semiconductor chip 20 in a plan view. That is, the first buffer film 61c can be selectively provided on a peripheral portion excluding a central part of the second main face 12a. Side wall faces of the first buffer film 61c on both sides of a direction, along which the plurality of first coolant-passages 13a is arrayed, are covered by the seal member 30e. The border line of the inner edge 311a of the second window 31a is located on the surface of the first buffer film 61c. Thus, the seal member 30e extends from the first main face 11a and reaches the second main face 12a via the two opposite first side faces 14a to cover the peripheral portion so as to exclude the central part of the second main face 12a.

And, because an area of the fourth window 31b is larger than the third window 64, the fourth window 31b exposes the surface of the second buffer film 62c in which the third window 64 is cut. That is, the third window 64 is provided in a part of an area of the second buffer film 62c, the region being exposed by the fourth window 31b. The third window 64 exposes at least an area of the fourth main face 12b corresponding to a projected area of the semiconductor chip 20 in a plan view. That is, the second buffer film 62c can be selectively provided on a peripheral portion excluding a central part of the fourth main face 12b. Side wall faces of the second buffer film 62c on both sides of a direction, along which the plurality of second coolant-passages 13b is arrayed, are covered by the seal member 30e. The border line of the inner edge 311b of the fourth window 31b is located on the surface of the second buffer film 62c. Thus, the seal member 30e extends from the third main face 11b and reaches the fourth main face 12b via the two opposite second side faces 14b to cover the peripheral portion so as to exclude the central part of the fourth main face 12b.

According to the semiconductor device of the fifth modification of the second embodiment, the first buffer film 61c has the first window 63 exposing at least the area of the second main face 12a corresponding to a projected area of the semiconductor chip 20 in a plan view. The second buffer film 62c has the third window 64 exposing at least the region of the fourth main face 12b corresponding to a projected area of the semiconductor chip 20 in a plan view. With the structure illustrated in FIG. 21, the first buffer film 61c and the second buffer film 62c are less affected by heat from the semiconductor chip 20 than in the fourth modification of the second embodiment. Since change in temperature of the first buffer film 61c and the second buffer film 62c is reduced, the thermal stress due to the difference in the coefficient of thermal expansion is suppressed, thereby improving reliability of the semiconductor device.

In addition, according to the semiconductor device of the fifth modification of the second embodiment, another circuit components or elements that need cooling can be directly bonded to the second main face 12a exposed by the first window 63 and to the fourth main face 12b exposed by the third window 64. It is therefore possible to further enhance the cooling performance of the entire system.

Other Embodiments

Although the first and second embodiments of the present invention have been described above, it should not be understood that the description and drawings constituting a part of this disclosure limit the invention. From this disclosure, various alternative embodiments, examples, and operational techniques will be apparent to those skilled in the art.

Figure 22:
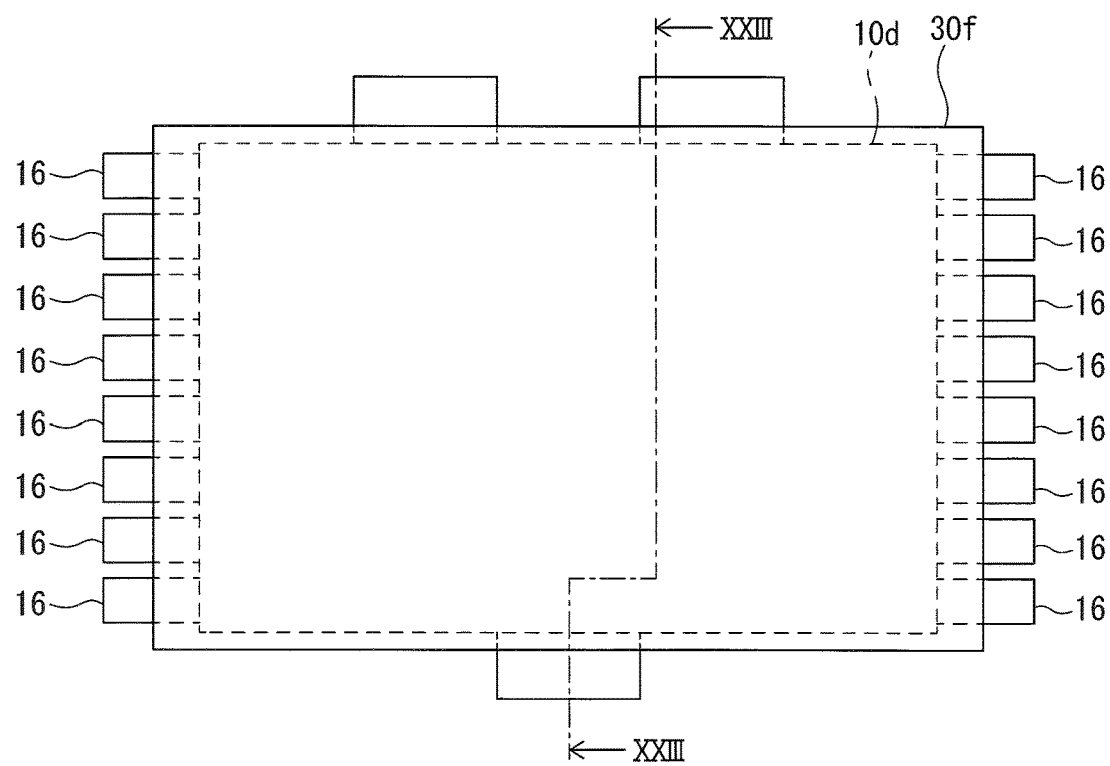
FIG. 22 is a top plan view of a basic structure of a semiconductor device according to other embodiment of the present invention.
Figure 23:
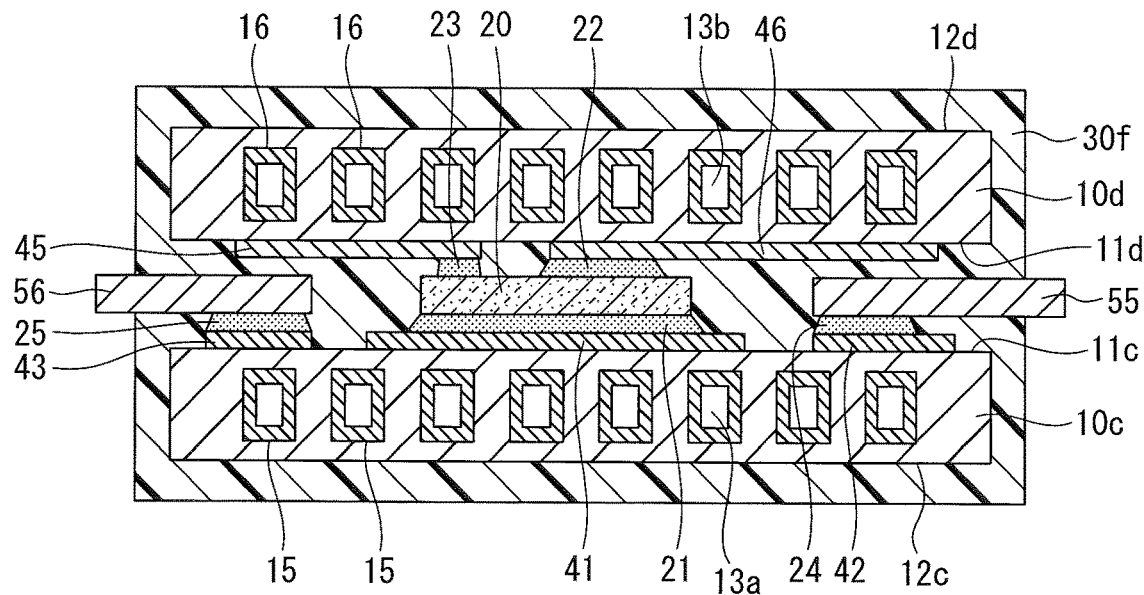
FIG. 23 is a cross-sectional view taken along line XXIII-XXIII of FIG. 22.

The semiconductor device of the first and second embodiments may include a plurality of metallic pipes respectively passing through the plurality of coolant-passages of the cooler(s), for example. As illustrated in FIGS. 22 and 23, a plurality of first metallic pipes 15 is provided to pass through the plurality of hollow spaces defined by the first coolant-passages 13a of a first cooler 10c. Similarly, a plurality of second metallic pipes 16 is provided to pass through the plurality of hollow spaces defined by the second coolant-passages 13b of a second cooler 10d as illustrated in FIGS. 22 and 23.

Each of the plurality of first metallic pipes 15 and the plurality of second metallic pipes 16 is made of metal, such as Cu and the like. The plurality of first metallic pipes 15 protrudes from both ends of the plurality of first coolant-passages 13a. Both end sides of the plurality of first metallic pipes 15 are exposed from the plurality of first coolant-passages 13a of the first cooler 10c. The plurality of second metallic pipes 16 protrudes from both ends of the plurality of second coolant-passages 13b. Both end sides of the plurality of second metallic pipes 16 are exposed from the plurality of second coolant-passages 13b of the second cooler 10d.

The plurality of first metallic pipes 15 is arranged in line in a mold, for example, and may be embedded in the plurality of first coolant-passages 13a by sintering when the first cooler 10c is molded by a material of ceramics filled in the mold. Similarly, the plurality of second metallic pipes 16 may be embedded in the plurality of second coolant-passages 13b by sintering when the second cooler 10d is molded. The plurality of first metallic pipes 15 and the plurality of second metallic pipes 16 are firmly bonded to the first cooler 10c and the second cooler 10d, respectively, within the plurality of first coolant-passages 13a and the plurality of second coolant-passages 13b.

A seal member 30f seals an outer periphery of each of the first cooler 10c and the second cooler 10d in a cross-sectional direction, which is taken perpendicular to the longitudinal direction of the plurality of first coolant-passages 13a and the plurality of second coolant-passages 13b. The seal member 30f also seals both end faces of each of the first cooler 10c and the second cooler 10d in the longitudinal direction of the plurality of first coolant-passages 13a and the plurality of second coolant-passages 13b. The seal member 30f seals the both end sides of each of the plurality of first metallic pipes 15 and the plurality of second metallic pipes 16, which protrude from the first cooler 10c and the second cooler 10d, respectively, to expose a tip portion of each of the plurality of first metallic pipes 15 and the plurality of second metallic pipes 16.

Thus, because the seal member 30f is bonded to the plurality of first metallic pipes 15 and the plurality of second metallic pipes 16 having higher adhesion than ceramics, it is possible for the seal member 30f to completely seal a boundary between the first cooler 10c and the second cooler 10d. It is therefore possible to further suppress the peeling from the first cooler 10c and the second cooler 10d.

Figure 24:
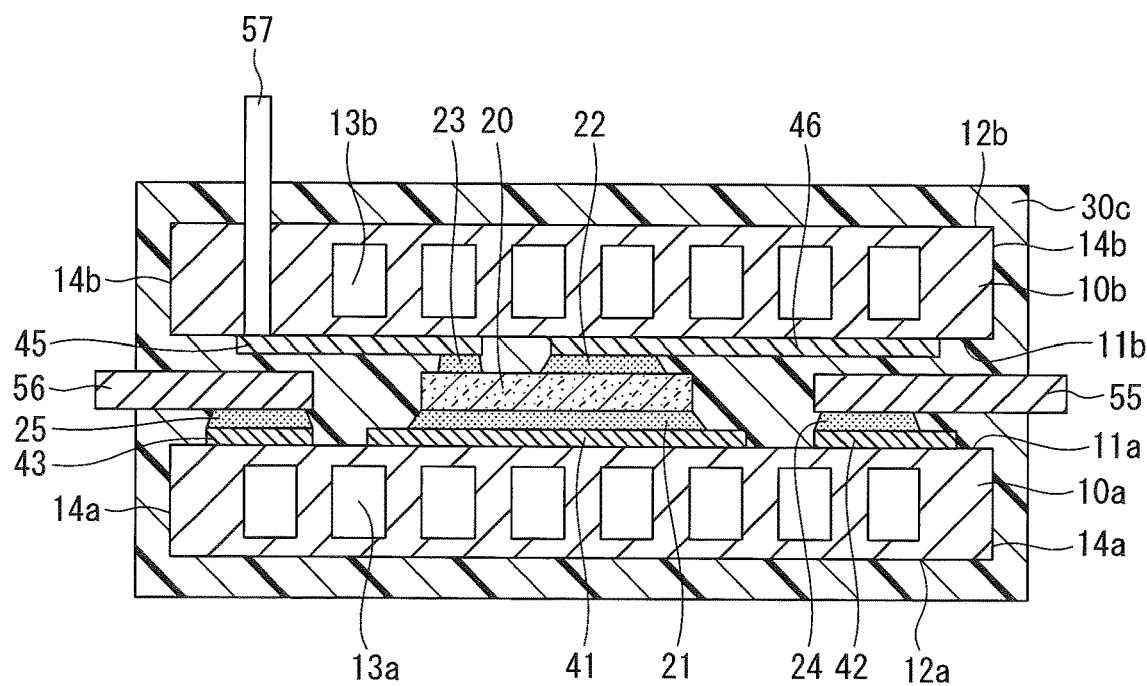
FIG. 24 is a cross-sectional view of a basic structure of a semiconductor device according to still the other embodiment of the present invention.

In the other embodiment, as illustrated in FIG. 24, a control terminal 57 such as a cylindrical conductive pin may be provided penetrating between the third main face 11b and the fourth main face 12b of the second cooler 10b. The control terminal 57 is bonded to the second conductive-pattern layer 45 on the third main face 11b, thereby being electrically connected to the control electrode of the semiconductor chip 20. The control terminal 57 protrudes upward from an upper surface of the seal member 30c. The control terminal 57 is made of metal, such as Cu, copper alloy and the like. Instead of the circular cylindrical shape, the control terminal 57 may have another shape, such as a polygonal column. In addition, the control terminal 57 may be plated with Ni, Au or the like.

As described above, the cooler 10, 10a, 10b includes the plurality of coolant-passages 13, 13a, 13b. However, the cooler 10, 10a, 10b may include a single coolant-passage. Moreover, each of the plurality of coolant-passages 13, 13a, 13b may be folded back inside the cooler 10, 10a, 10b and each of windows of the plurality of coolant-passages 13, 13a, 13b may be provided only on a side face. Furthermore, each of the plurality of coolant-passages 13, 13a, 13b may be folded back inside the cooler 10, 10a, 10b to form one continuous coolant-passage.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a cooler comprising a ceramic block having a coolant-passage and, having a first main face and a second main face, being parallel and opposite to the first main face, defined by two opposite side faces perpendicular to the first and second main faces, the ceramic block comprising a single ceramic layer;
   a plurality of conductive-pattern layers delineated on the first main face;
   a semiconductor chip mounted on the first main face via one of the plurality of conductive-pattern layers;
   a seal member including a resin and a filler, configured to seal the semiconductor chip and the plurality of conductive-pattern layers so as to extend from a portion of one of the two opposite side faces over the first main face to a portion of the other one of the two opposite side faces of the ceramic block, defining an opening exposing the second main face of the ceramic block; and a buffer film bonded to the second main face and made of a material having a larger coefficient of thermal expansion than that of the ceramic block, wherein the seal member extends around edges of the two opposite side faces and further covers a peripheral portion defined on a peripheral area of the second main face, the buffer film covers the peripheral portion of the second main face to provide a first window exposing the second main face, the seal member covers an outer area of the peripheral portion of the second main face to provide a second window larger than the first window, the second window exposing the surface of the buffer film in which the first window is cut, the first window and the second window expose at least an area of the second main face corresponding to a projected area of the semiconductor chip, and the seal member has a coefficient of thermal expansion ranging from $13 \times 10^{-6}$ to $30 \times 10^{-6}$ (/K).

2. The semiconductor device of claim 1, wherein the coolant-passage penetrates through the single ceramic layer between the first and second main faces, configured to flow a coolant.

3. The semiconductor device of claim 2, wherein the buffer film has grooves cut from an opposite plane of the buffer film, the opposite plane is opposite to a contacting plane of the buffer film, and the contacting plane contacts the second main face.

4. The semiconductor device of claim 1, wherein the seal member extends to cover a peripheral area of the buffer film, defining an opening exposing at least the surface of the buffer film corresponding to a projected area of the semiconductor chip, and wherein a border line of the opening is surrounded by an inner edge of the seal member disposed on the buffer film.

5. The semiconductor device of claim 1, wherein the buffer film has grooves cut from an opposite plane of the buffer film, the opposite plane is opposite to a contacting plane of the buffer film, and the contacting plane contacts the second main face.

6. The semiconductor device of claim 1, wherein the coefficient of thermal expansion of the seal member is adjustable by changing an addition amount of the filler to the resin.

7. A semiconductor device comprising:
a ceramic cooler including a ceramic block having a coolant-passage and having a first main face and a second main face parallel and opposite to the first main face, the ceramic block having two opposite side faces perpendicular to the first and second main faces, the ceramic block comprising a single ceramic layer;
a plurality of conductive-pattern layers delineated on the first main face;
a semiconductor chip mounted on the first main face of the ceramic block via one of the plurality of conductive-pattern layers;
a buffer film bonded to the second main face and made of a material having a larger coefficient of thermal expansion than that of ceramics of the ceramic block
a seal member including a resin and a filler, configured to seal the semiconductor chip and the plurality of conductive-pattern layers so as to cover at least a portion of the first main face and extend around edges of the first main face to further cover at least a portion of the two opposite side faces of the ceramic block, extend around edges of the two opposite side faces, to cover a peripheral portion of the second main face, and extend to cover a peripheral area of the buffer film, wherein the seal member includes an opening exposing at least an area of the second main face or the buffer film corresponding to a projected area of the semiconductor chip, the buffer film covers the peripheral portion of the second main face to provide a first window exposing the second main face, the seal member covers an outer area of the peripheral portion of the second main face to provide a second window larger than the first window, the second window exposes the surface of the buffer film in which the first window is cut, and the first window and the second window expose at least an area of the second main face corresponding to a projected area of the semiconductor chip.

8. The semiconductor device of claim 7, wherein
the seal member extends to cover a peripheral area of the buffer film, defining an opening exposing at least the surface of the buffer film corresponding to a projected area of the semiconductor chip, and
a border line of the opening is surrounded by an inner edge of the seal member disposed on the buffer film.

9. The semiconductor device of claim 7, wherein
the buffer film has grooves cut from an opposite plane of the buffer film,
the opposite plane is opposite to a contacting plane of the buffer film, and
the contacting plane is in contact with the second main face.

10. The semiconductor device of claim 7, wherein the ceramic block is formed of silicon nitride, and wherein the buffer is formed of copper.

11. A semiconductor device comprising:
a cooler comprising a ceramic block having a coolant-passage and, having a first main face and a second main face, being parallel and opposite to the first main face, defined by two opposite side faces perpendicular to the first and second main faces, the ceramic block comprising a single ceramic layer;
a plurality of conductive-pattern layers delineated on the first main face;
a semiconductor chip mounted on the first main face via one of the plurality of conductive-pattern layers;
a seal member including a resin and a filler, configured to seal the semiconductor chip and the plurality of conductive-pattern layers so as to cover at least a portion of the first main face and extend around edges of the first main face to further cover at least a portion of the two opposite side faces of the cooler, and
a buffer film bonded to the second main face and made of a material having a larger coefficient of thermal expansion than that of the ceramic block, wherein
the buffer film covers the peripheral portion of the second main face to provide a first window exposing the second main face,
the seal member covers an outer area of the peripheral portion of the second main face to provide a second window larger than the first window,
the second window exposes the surface of the buffer film in which the first window is cut,
the first window and the second window expose at least an area of the second main face corresponding to a projected area of the semiconductor chip the seal member has a coefficient of thermal expansion ranging from $13\times10^{-6}$ to $30\times10^{-6}$ (/K), and the coefficient of thermal expansion of the buffer film is equal or smaller than $25\times10^{-6}$ (/K).

* * * * *